United States Patent
Handa et al.

(10) Patent No.: US 8,704,811 B2
(45) Date of Patent: Apr. 22, 2014

(54) IMAGE DISPLAY APPARATUS

(71) Applicant: Sony Corporation, Tokyo (JP)

(72) Inventors: Tomoaki Handa, Tokyo (JP); Takayuki Taneda, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/068,018

(22) Filed: Oct. 31, 2013

(65) Prior Publication Data

US 2014/0055431 A1    Feb. 27, 2014

Related U.S. Application Data

(63) Continuation of application No. 13/920,452, filed on Jun. 18, 2013, now Pat. No. 8,605,065, which is a continuation of application No. 12/461,450, filed on Aug. 12, 2009, now Pat. No. 8,502,808.

(30) Foreign Application Priority Data

Sep. 4, 2008    (JP) .................................. 2008-226759

(51) Int. Cl.
G06F 3/038    (2013.01)
(52) U.S. Cl.
USPC .............. 345/206; 345/78; 345/204; 345/213
(58) Field of Classification Search
USPC ....................................................... 345/206
See application file for complete search history.

(56) References Cited

U.S. PATENT DOCUMENTS

| 2005/0168491 A1 | 8/2005 | Takahara et al. |
| 2006/0170628 A1* | 8/2006 | Yamashita et al. ............... 345/76 |
| 2008/0024475 A1* | 1/2008 | Takenaka et al. ............. 345/206 |

FOREIGN PATENT DOCUMENTS

| JP | 2004-126439 A | 4/2004 |
| JP | 2005-148335 A | 6/2005 |
| JP | 2007-115563 A | 5/2007 |
| JP | 2007-133284 A | 5/2007 |
| JP | 2007-155754 A | 6/2007 |
| JP | 2007-310311 A | 11/2007 |
| JP | 2008-046393 A | 2/2008 |
| JP | 2008-122632 A | 5/2008 |
| JP | 2008-152095 A | 7/2008 |
| JP | 2008-181006 A | 8/2008 |
| JP | 2008-199054 A | 8/2008 |

OTHER PUBLICATIONS

Japanese Office Action issued Dec. 11, 2012 for corresponding Japanese Application No. 2008-226759.

* cited by examiner

*Primary Examiner* — Charles V Hicks
(74) *Attorney, Agent, or Firm* — Rader, Fishman & Grauer PLLC

(57) ABSTRACT

The present invention provides an active matrix image display apparatus including an organic EL element capable of efficiently arranging a wiring pattern on an insulating substrate compared to the related art. The present invention provides a dummy region arranged at the outermost periphery of a display unit as a scanning line coupling region or a pitch conversion region. A power supply scanning line is commonly used by a pixel circuit of an odd-numbered line and a pixel circuit of a following even-numbered line.

12 Claims, 23 Drawing Sheets

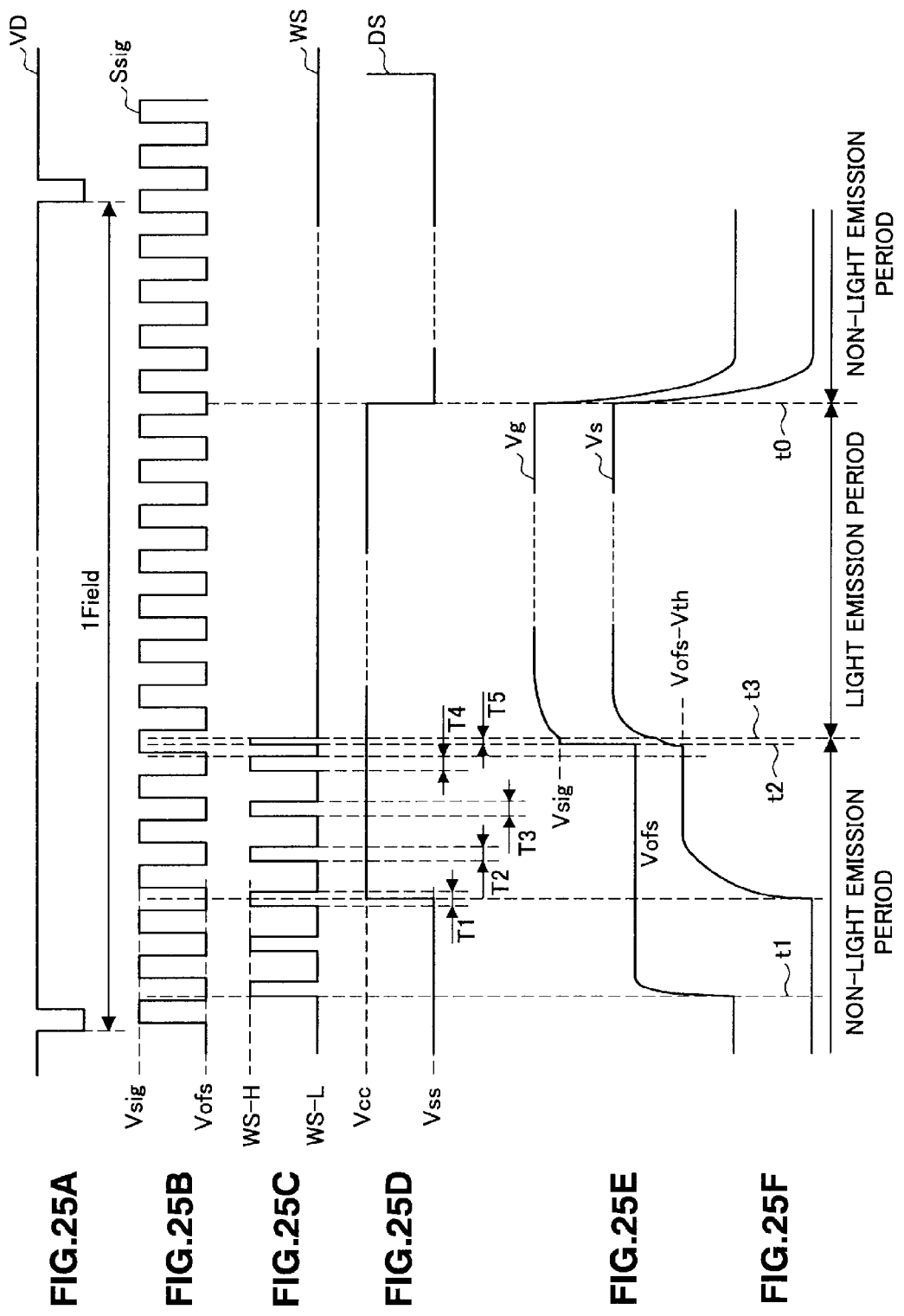

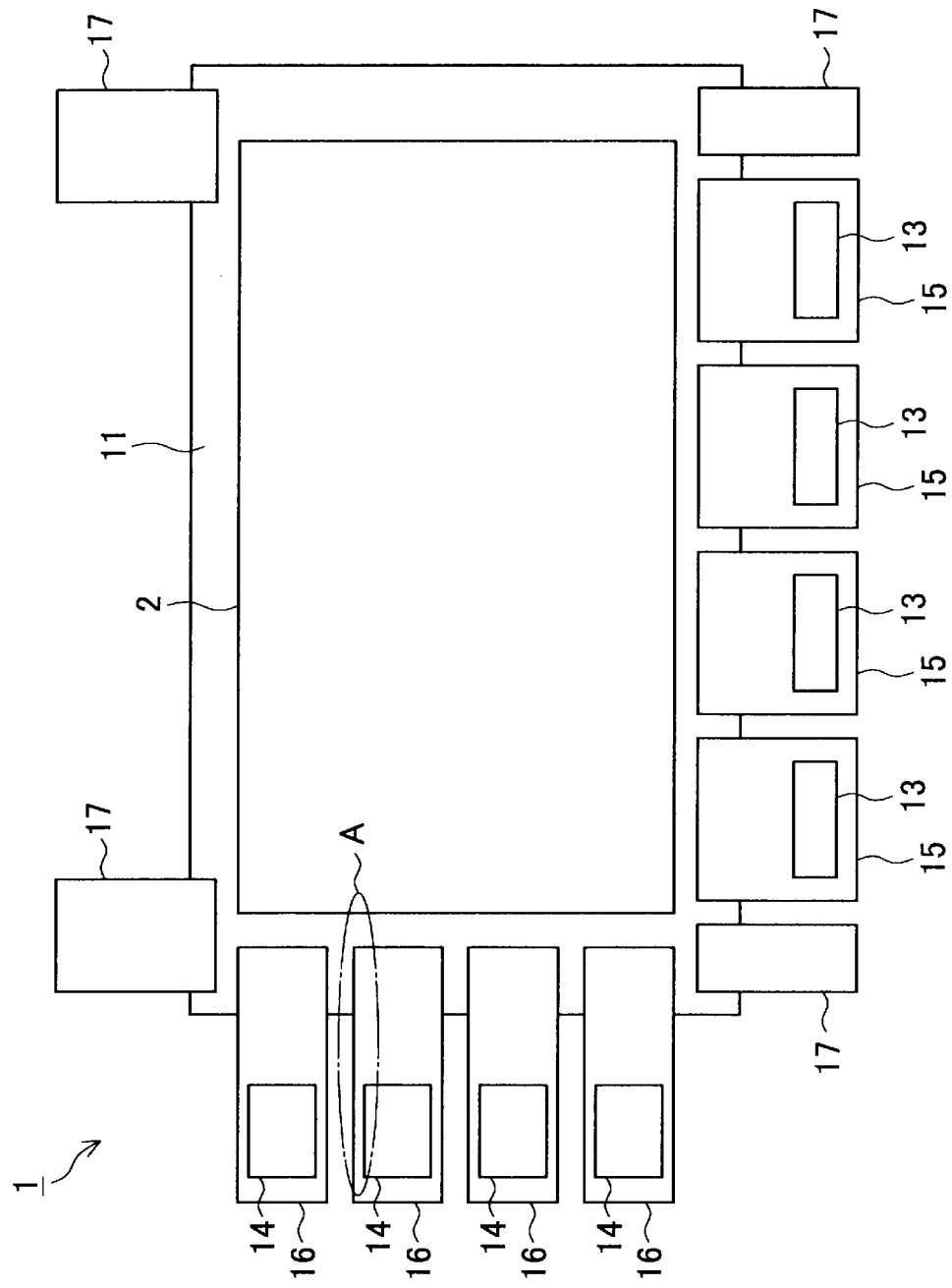

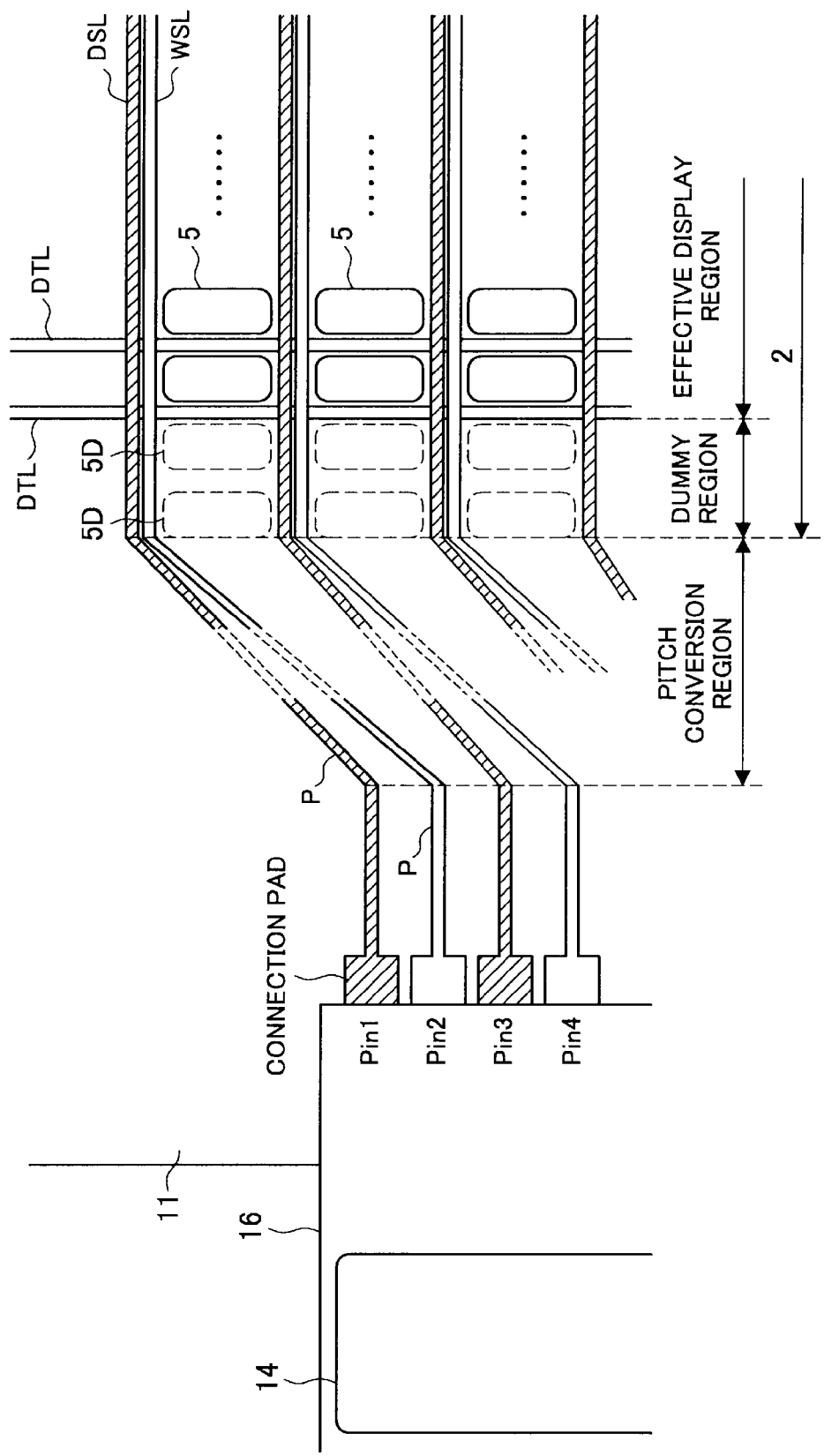

IMAGE DISPLAY APPARATUS

CROSS REFERENCES TO RELATED APPLICATIONS

This is a Continuation Application of U.S. patent application Ser. No. 13/920,452, filed Jun. 18, 2013, which is a Continuation Application of U.S. patent application Ser. No. 12/461,450 filed Aug. 12, 2009, now U.S. Pat. No. 8,502,808, issued on Aug. 6, 2013, which in turn claims priority from Japanese Application No.: 2008-226759, filed on Sep. 4, 2008, the entire contents of which are incorporated herein by reference.

BACKGROUND OF THE INVENTION

1. Field of the Invention

The present invention relates to image display apparatus, and for example, can be applied to an active matrix image display apparatus including an organic EL (Electro Luminescence) element. The present invention enables a wiring pattern on an insulating substrate to be efficiently arranged compared to the related art by having a dummy region arranged at an outermost periphery of a display unit as a scanning line coupling region or a pitch conversion region, or by having a power supply scanning line commonly used by a pixel circuit of odd-numbered lines and a pixel circuit of even-numbered lines.

2. Description of Related Art

In recent years, development of the active matrix image display apparatus using the organic EL element is advancing. The image display apparatus using the organic EL element is an image display apparatus that utilizes a luminous phenomenon of an organic thin-film that emits light by application of electric field. The organic EL element can be driven at an application voltage of smaller than or equal to 10[V]. Therefore, this type of image display apparatus can reduce the power consumption. The organic EL element is a self-luminous element. Therefore, this type of image display apparatus may not include a backlight device, and thus can have lighter weight and can be thinned. The organic EL element has a characteristic in that a response speed is fast or about a few μseconds. Therefore, this type of image display apparatus has a characteristic in that a residual image barely generates when displaying a moving image.

Specifically, the active matrix image display apparatus using the organic EL element arranges a pixel circuit including the organic EL element and a drive circuit for driving the organic EL element in a matrix form to form a display unit. This type of image display apparatus drives each pixel circuit by the signal line drive circuit and the scanning line drive circuit arranged at the periphery of the display unit by way of the signal line and the scanning line arranged in the display unit to display the desired image.

Regarding the image display apparatus using the organic EL element, Japanese Patent Application Laid-Open No. 2007-310311 discloses a method of configuring a pixel circuit using two transistors. Therefore, the configuration can be simplified according to the method disclosed in Japanese Patent Application Laid-Open No. 2007-310311. Japanese Patent Application Laid-Open No. 2007-310311 also discloses a configuration of correcting the variation in the threshold voltage of the drive transistor for driving the organic EL element and the variation in the mobility. Therefore, degradation in image quality caused by the variation in the threshold value of the drive transistor and the variation in the mobility can be prevented according to the configuration disclosed in Japanese Patent Application Laid-Open No. 2007-310311.

FIG. 14 is a block diagram showing an image display apparatus disclosed in Japanese Patent Application Laid-Open No. 2007-310311. The image display apparatus 1 has a display unit 2 formed on an insulating substrate of glass and the like. The image display apparatus 1 has a signal line drive circuit 3 and a scanning line drive circuit 4 formed at the periphery of the display unit 2.

The display unit 2 is formed by arranging a pixel circuit 5 in a matrix form, where the organic EL element arranged in the pixel circuit 5 forms a pixel (PIX) 6. In an image display apparatus for color image, one pixel is formed by a plurality of sub-pixels of red, green, and blue, and thus the display unit 2 is configured by sequentially arranging the pixel circuits 5 for red, for green, and for blue respectively configuring the sub-pixels of red, green, and blue in the case of the image display apparatus for color image.

The signal line drive circuit 3 outputs a drive signal Ssig for the signal line to a signal line DTL arranged in the display unit 2. More specifically, the signal line drive circuit 3 sequentially latches image data D1 input in a raster scanning order and allocates the image data D1 to the signal line DTL, and then performs the digital-analog conversion process in the data scan circuit 3A. The signal line drive circuit 3 processes the digital-analog conversion result, and generates the drive signal Ssig. The image display apparatus 1 thereby sets a tone of each pixel circuit 5 in a so-called line sequential manner.

The scanning line drive circuit 4 outputs a write signal WS and a drive signal S to the scanning line WSL for write signal and the scanning line DSL for power supply, respectively, arranged in the display unit 2. The write signal WS is a signal for ON/OFF controlling a write transistor arranged in each pixel circuit 5. The drive signal DS is a signal for controlling the drain voltage of the drive transistor arranged in each pixel circuit 5. The scanning line drive circuit 4 processes a predetermined sampling pulse SP with a clock CK and generates the write signal WS and the drive signal DS in a write scan circuit (WSCN) 4A and a drive scan circuit (DSCM) 4B.

FIG. 15 is a connection diagram showing the configuration of the pixel circuit 5 in detail. The pixel circuit 5 has a cathode of the organic EL element 7 set to a predetermined negative side voltage, where such negative side voltage is set to the voltage of the earth line in the example of FIG. 15. The pixel circuit 5 has an anode of the organic EL element 8 connected to a source of the drive transistor Tr2. The drive transistor Tr2 is an N-channel transistor including TFT. The pixel circuit 5 has the drain of the drive transistor Tr2 connected to the power supply scanning line DSL, and the power supply drive signal DS is provided to the scanning line DSL from the scanning line drive circuit 4. The pixel circuit 5 then current drives the organic EL element 8 using the drive transistor Tr2 of the source-follower circuit configuration.

The pixel circuit 5 has a retention capacity Cs arranged between the gate and the source of the drive transistor Tr2, and the gate side voltage of the retention capacity Cs is set to the voltage of the drive signal Ssig by the write signal WS. As a result, the pixel circuit 5 current drives the organic EL element 8 with the drive transistor Tr2 by the gate-source voltage Vgs corresponding to the drive signal Ssig. In FIG. 15, a capacity Ce1 is a stray capacitance of the organic EL element 8. In the following description, the capacity Ce1 has a sufficiently large capacity compared to the retention capacity Cs, and the parasitic capacitance of the gate node of the drive transistor Tr2 is sufficiently small compared to the retention capacity Cs.

In other words, the pixel circuit 5 has the gate of the drive transistor Tr2 connected to the signal line DTL by way of the write transistor Tr1 that ON/OFF operates by the write signal WS. The write transistor Tr1 is an N-channel transistor including TFT. The signal line drive circuit 3 switches the tone setting voltage Vsig and the threshold voltage correction fixed voltage Vofs at a predetermined timing, and outputs the drive signal Ssig. The threshold voltage correction fixed voltage Vofs is a fixed voltage used to correct the variation in the threshold voltage of the drive transistor Tr2. The tone setting voltage Vsig is a voltage instructing the light emission luminance of the organic EL element 8, and is a voltage obtained by adding the threshold voltage correction fixed voltage Vofs to the tone voltage Vin. The tone voltage Vin is a voltage corresponding to the light emission luminance of the organic EL element 8. The tone voltage Vin is generated for every signal line DTL by performing digital-analog conversion process on the image data D1 allocated to each signal line DTL.

As shown in FIG. 16, the pixel circuit 5 has the write transistor Tr1 set to the OFF state by the write signal WS during the light emission period of light emitting the organic EL element 8 (FIG. 16A). The pixel circuit 5 has the power supply voltage Vcc supplied to the drive transistor Tr2 by the power supply drive signal DS during the light emission period (FIG. 16B). The pixel circuit 5 thus light emits the organic EL element 8 with the drive current Ids corresponding to the gate-source voltage Vgs (FIGS. 16D and 16E) of the drive transistor Tr2 or the inter-terminal voltage of the retention capacity Cs during the light emission period.

In the pixel circuit 5, the power supply drive signal DS reduces to a predetermined fixed voltage Vss at time point t0 when the light emission period ends (FIG. 16B). The fixed voltage Vss is a voltage sufficiently low to function the drain of the drive transistor Tr2 as a source, and is a voltage lower than the cathode voltage of the organic EL element 8.

As shown in FIG. 18, in the pixel circuit 5, the accumulated charges of the organic EL element 8 side end of the retention capacity Cs flow out to the scanning line via the drive transistor Tr2. As a result, in the pixel circuit 5, the source voltage Vs of the drive transistor Tr2 reduces to substantially the voltage Vss (FIG. 16E), and the organic EL element 8 stops light emission. Furthermore, in the pixel circuit 5, the gate voltage Vg of the drive transistor Tr2 lowers in conjunction with the lowering of the source voltage Vs (FIG. 16D).

The pixel circuit 5 has the write transistor Tr1 switched to the ON state by the write signal WS at the following predetermined time point t1 (FIG. 16A), and the gate voltage Vg of the drive transistor Tr2 is set to the threshold voltage correction fixed voltage Vofs set to the signal line DTL (FIGS. 16C and 16D). As shown in FIG. 19, the pixel circuit 5 has the gate-source voltage Vgs of the drive transistor Tr2 set to substantially the voltage Vofs-Vss. The pixel circuit 5 has the voltage Vofs-Vss set to a voltage greater than the threshold voltage Vth of the drive transistor Tr2 setting the voltages Vofs, Vss.

Thereafter, in the pixel circuit 5, the drain voltage of the drive transistor Tr2 reduces to the power supply voltage Vcc by the drive signal DS at time point t2 (FIG. 16B). As shown in FIG. 20, in the pixel circuit 5, the charging current Ids flows in from the power supply Vcc to the organic EL element 8 side end of the retention capacity Cs through the drive transistor Tr2. As a result, the voltage Vs on the organic EL element 8 side end of the retention capacity Cs gradually rises in the pixel circuit 5. In this case, in the pixel circuit 5, the current Ids flowing into the organic EL element 8 through the drive transistor Tr2 is used only in charging the capacity Cel and the retention capacity Cs of the organic EL element 8, and as a result, only the source voltage Vs of the drive transistor Tr2 is merely raised without light emitting the organic EL element 8.

In the pixel circuit 5, the flowing in of the charging current Ids through the drive transistor Tr2 stops when the inter-terminal voltage of the retention capacity Cs becomes the threshold voltage Vth of the drive transistor Tr2. Therefore, in this case, the rise of the source voltage Vs of the drive transistor Tr2 stops when the potential difference of both ends of the retention capacity Cs becomes the threshold voltage Vth of the drive transistor Tr2. The pixel circuit 5 thus discharges the inter-terminal voltage of the retention capacity Cs through the drive transistor Tr2, and sets the inter-terminal voltage of the retention capacity Cs to the threshold voltage Vth of the drive transistor Tr2.

When a sufficient time for setting the inter-terminal voltage of the retention capacity Cs to the threshold voltage Vth of the drive transistor Tr2 has elapsed and time point t3 is reached, the pixel circuit 5 has the write transistor Tr1 switched to the OFF state by the write signal, as shown in FIG. 21 (FIG. 16A). Subsequently, as shown in FIG. 22, the voltage of the signal line DTL is set to the tone setting voltage Vsig (=Vin+Vofs).

The pixel circuit 5 has the write transistor Tr1 set to the ON state in the following time point t4 (FIG. 16A). As shown in FIG. 23, the pixel circuit 5 has the gate voltage Vg of the drive transistor Tr2 set to the tone setting voltage Vsig, and the gate-source voltage Vgs of the drive transistor Tr2 set to the voltage in which the threshold voltage Vth of the drive transistor Tr2 is added to the tone voltage Vin. The pixel circuit 5 can effectively avoid the variation of the threshold voltage Vth of the drive transistor Tr2 and drive the organic EL element 8, and can prevent degradation in image quality due to variation in the light emission luminance of the organic EL element 8.

When setting the gate voltage Vg of the drive transistor Tr2 to the tone setting voltage Vsig, the pixel circuit 5 has the gate of the drive transistor Tr2 connected to the signal line DTL for a constant period while holding the drain voltage of the drive transistor Tr2 at the power supply voltage Vcc. The variation in the mobility μ of the drive transistor Tr2 is thereby also corrected in the pixel circuit 5.

In other words, when the write transistor Tr1 is set to the ON state and the gate of the transistor Tr2 is connected to the signal line DTL with the inter-terminal voltage of the retention capacity Cs set to the threshold voltage Vth of the drive transistor Tr2, the gate voltage Vg of the drive transistor Tr2 gradually rises from the fixed voltage Vofs and is set to the tone setting voltage Vsig.

In the pixel circuit 5, the write time constant for the rise of the gate voltage Vg of the drive transistor Tr2 is set short compared to the time constant for the rise of the source voltage Vs by the drive transistor Tr2.

In this case, when the write transistor Tr1 is ON operated, the gate voltage Vg of the drive transistor Tr2 rapidly rises to the tone setting voltage Vsig (Vofs+Vin). In time of the rise of the gate voltage Vg, the source voltage Vs of the drive transistor Tr2 does not fluctuate if the capacity Cel of the organic EL element 8 is sufficiently large compared to the retention capacity Cs.

However, if the gate-source voltage Vgs of the drive transistor Tr2 becomes greater than the threshold voltage Vth, the current Ids flows in from the power supply Vcc via the drive transistor Tr2, and the source voltage Vs of the drive transistor Tr2 gradually rises. As a result, in the pixel circuit 5, the inter-voltage voltage of the retention capacity Cs discharges from the drive transistor Tr2, and the rising speed of the gate-source voltage Vgs lowers.

The discharge speed of the inter-terminal voltage changes according to the ability of the drive transistor Tr2. More specifically, the discharge speed becomes faster the larger the mobility μ of the drive transistor Tr2.

As a result, the pixel circuit 5 is set such that the inter-terminal voltage of the retention capacity Cs lowers for the drive transistor Tr2 of large mobility μ, and the variation in the light emission luminance due to the variation of the mobility is corrected. The amount of lowering of the inter-terminal voltage related to the correction of the mobility μ is shown as ΔV in FIG. 16, FIG. 23, and FIG. 24.

In the pixel circuit 5, the write signal WS falls at time point t5 after the elapse of the correction period of the mobility. As a result, the pixel circuit 5 starts the light emission period, and light emits the organic EL element 8 by the drive current Ids corresponding to the inter-terminal voltage of the retention capacity Cs, as shown in FIG. 24. When the light emission period starts, the gate voltage Vg and the source voltage Vs of the drive transistor Tr2 rise by a so-called boot strap circuit in the pixel circuit 5. Ve1 in FIG. 24 is the voltage of the amount of rise.

Therefore, the pixel circuit 5 executes the preparation of the process of correcting the threshold voltage of the drive transistor Tr2 during a period in which the gate voltage of the drive transistor Tr2 is lowered to the voltage Vss from time point t0 to time point 2. In the following period from time point t2 to time point t3, the inter-terminal voltage of the retention capacity Cs is set to the threshold voltage Vth of the drive transistor Tr2, and the threshold voltage of the drive transistor Tr2 is corrected. From time point t4 to time point t5, the mobility of the drive transistor Tr2 is corrected and the tone setting voltage Vsig is sampled.

Japanese Patent Application Laid-Open No. 2007-133284 proposes a configuration of executing a process of correcting the variation in the threshold voltage of the drive transistor Tr2 over plural times. According to the configuration of the disclosure in Japanese Patent Application Laid-Open No. 2007-133284, sufficient time can be given to the correction of the variation of the threshold voltage even if higher accuracy is achieved and the time assigned to tone setting of the pixel circuit is reduced. Therefore, degradation in image quality due to the variation of the threshold voltage can be prevented even when the accuracy is increased.

Therefore, a display apparatus capable of maintaining high image quality even when the accuracy is increased is obtained with a simple configuration by applying the method disclosed in Japanese Patent Application Laid-Open No. 2007-133284 to the method disclosed in Japanese Patent Application Laid-Open No. 2007-310311.

FIG. 25 is a time chart of the pixel circuit that can be assumed when the method disclosed in Japanese Patent Application Laid-Open No. 2007-133284 is applied to the method disclosed in Japanese Patent Application Laid-Open No. 2007-310311, in comparison to FIG. 16.

In this case, the tone setting voltage Vs of each pixel circuit 5 connected to the signal line DTL is output to the signal line DTL with the threshold voltage correction fixed voltage Vofs in between. In the pixel circuit 5, the write signal WS is intermittently raised in correspondence to the drive of the signal line DTL, and the inter-terminal voltage of the retention capacity Cs is discharged through the drive transistor Tr2 in a plurality of periods. Specifically, in the example of FIG. 25, the variation correction of the threshold voltage of the drive transistor Tr2 is executed in four periods of periods T1, T2, T3, and T4, and then the mobility correction process and the tone setting process are executed in period T5. In FIG. 25, VD is a vertical synchronization signal.

FIG. 26 is a plan view showing an image display apparatus disclosed in Japanese Patent Application Laid-Open No. 2007-133284. The image display apparatus 1 has the display unit 2 formed at substantially the middle of the insulating substrate 11 of glass and the like. A signal line integrated circuit 13 and a scanning line integrated circuit 14 configuring the signal line drive circuit 3 and the scanning line drive circuit 4, respectively, are arranged at the periphery of the display unit 2. The integrated circuits 13, 14 are mounted on flexible wiring substrates 15 and 16, and then connected to the insulating substrate 11 through the flexible wiring substrates 15 and 16, and the flexible wiring substrates 15 and 16 are bent and arranged on the rear surface side of the insulating substrate 11. The image display apparatus 1 has a flexible wiring substrate 17 for supplying power and the like connected at four corners of the insulating substrate 11.

FIG. 27 is a plan view showing the area between the display unit 2 and the scanning line integrated circuit 14 shown with reference number A in FIG. 26 in a partially enlarged manner. The display unit 2 has a dummy region arranged at the outermost periphery of the effective display region, where equalization of the thermal profile is achieved when annealing the drive transistor Tr2 and the like using a dummy pixel circuit 5D arranged in the dummy region. Therefore, in the display unit 2, a region excluding the dummy region is the effective display region.

The display unit 2 is formed such that the pixel pitch in the vertical direction is 300 [μm]. The scanning line integrated circuit 14 is arranged with an electrode at an extremely small pitch, smaller than the pitch obtained by dividing the pixel pitch of the display unit 2 by the number of scanning lines assigned to one pixel circuit 5. Similarly, the signal line integrated circuit 13 is also arranged with an electrode at a pitch extremely short with respect to the pixel pitch of the display unit 2.

In the image display apparatus 1 of the related art, a pitch conversion region is arranged at the periphery of the display unit 2, where the pitch of the wiring pattern P by the electrode pitch of the integrated circuits 14, 15 is enlarged to the pitch of the signal line DTL, and the scanning lines DSL and WSL and connected to the signal line DTL, and the scanning lines DSL and WSL in the pitch conversion region.

SUMMARY OF THE INVENTION

The wiring patterns of the signal line DTL and the scanning lines DSL and WSL are desirably efficiently arranged on the insulating substrate 11. In other words, the image display apparatus can have a narrower frame if the wiring patterns are efficiently arranged at the area other than the display unit 2.

In each pixel circuit 5, on the other hand, the proportion of the wiring pattern occupying one pixel can be reduced and the yield can be enhanced if the wiring patterns are efficiently arranged. In some cases, short-circuit accidents and the like of the wiring pattern also can be effectively responded.

The present invention addresses the above-identified, and other issues associated with conventional methods and apparatus, and it is desirable to provide a new and improved image display apparatus capable of more efficiently arranging the wiring patterns on the insulating substrate compared to the related art.

According to an embodiment of the present invention, a display unit is formed by arranging pixel circuits on an insulating substrate in a matrix form. An integrated circuit for a signal line and a scanning line mounted on the insulating substrate is connected to a signal line and a scanning line of the display unit by the wiring pattern formed on the insulating substrate, and the integrated circuit for the scanning line outputs a drive signal of the scanning line to the wiring pattern for every unit in which the display unit is grouped by plural lines, has the pitch of the wiring pattern converted from the pitch of the terminal of the integrated circuit to the pitch of the corresponding unit in a pitch conversion region, and one wiring pattern by the pitch conversion region then connected to a plurality of scanning lines of the corresponding unit in a scanning line coupling region. The display unit has a dummy region arranged with a dummy pixel circuit formed at an outermost periphery, all or part of the scanning line coupling region being arranged in the dummy region.

Furthermore, according to another embodiment of the present invention, a display unit is formed by arranging pixel circuits on an insulating substrate in a matrix form. An integrated circuit for a signal line and a scanning line mounted on the insulating substrate is connected to a signal line and a scanning line of the display unit by the wiring pattern formed on the insulating substrate, and the integrated circuit for the signal line or the scanning line has a pitch of the wiring pattern converted from a pitch of the terminal of the integrated circuit to a pitch of the corresponding signal line or the scanning line, and connected to the signal line or the scanning line in a pitch conversion region. The display unit has a dummy region arranged with a dummy pixel circuit arranged at an outermost periphery, all or part of the pitch conversion region being arranged in the dummy region.

Furthermore, according to another embodiment of the present invention, a display unit is formed by arranging pixel circuits on an insulating substrate in a matrix form, and an integrated circuit for a signal line and a scanning line mounted on the insulating substrate is connected to a signal line and a scanning line of the display unit by the wiring pattern formed on the insulating substrate. Here, the display unit has the scanning line of a power supply drive signal commonly used by a pixel circuit of an odd-numbered line and a pixel circuit of a following even-numbered line.

According to the above configuration, the wiring pattern can be efficiently arranged at the periphery of the display unit by arranging all or part of the scanning line coupling region in the dummy region formed at the outermost periphery of the display unit. Therefore, the frame of the image display apparatus can be narrowed.

According to the above configuration, the wiring pattern can be efficiently arranged at the periphery of the display unit by arranging all or part of the pitch conversion region in the dummy region formed at the outermost periphery of the display unit. Therefore, the frame of the image display apparatus can be narrowed.

According to the above configuration, the wiring pattern can be efficiently arranged with respect to the configuration of the pixel circuit arranged at the display unit by commonly using the scanning line of the power supply drive signal between the pixel circuit of odd-numbered line and the pixel circuit of even-numbered line. The proportion of the wiring pattern occupying one pixel can be reduced, and the yield can be enhanced.

According to the embodiments of the present invention, the wiring pattern can be efficiently arranged on the insulating substrate compared to the related art.

BRIEF DESCRIPTION OF THE DRAWINGS

FIGS. 4A to 4C4 are a time chart describing the operation of the image display apparatus of FIG. 2;

FIGS. 12A to 12C2C are a time chart describing an image display apparatus according to another embodiment of the present invention;

FIGS. 25A to 25F are a time chart describing a case in which the threshold voltage correction process is executed over plural periods;

FIG. 26 is a plan view showing a connection of the image display apparatus of the related art; and FIG. 27 is a plan view showing the image display apparatus of FIG. 26 in a partially enlarged manner.

DETAILED DESCRIPTION OF PREFERRED EMBODIMENTS

Figure 1:
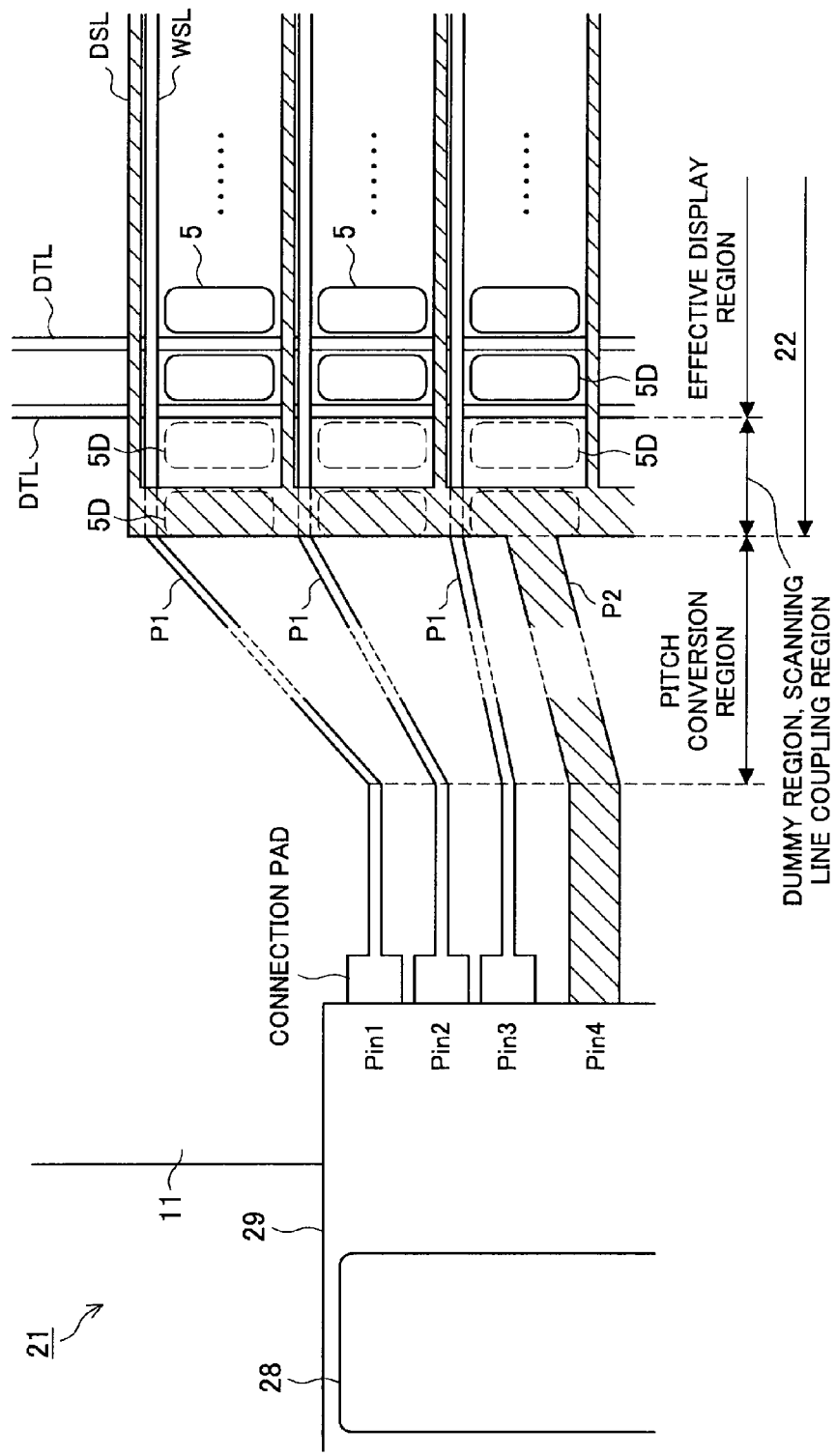
FIG. 1 is a plan view showing an image display apparatus according to a first embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First Embodiment

[Configuration of the Embodiment]
[Overall Configuration]

Figure 2:
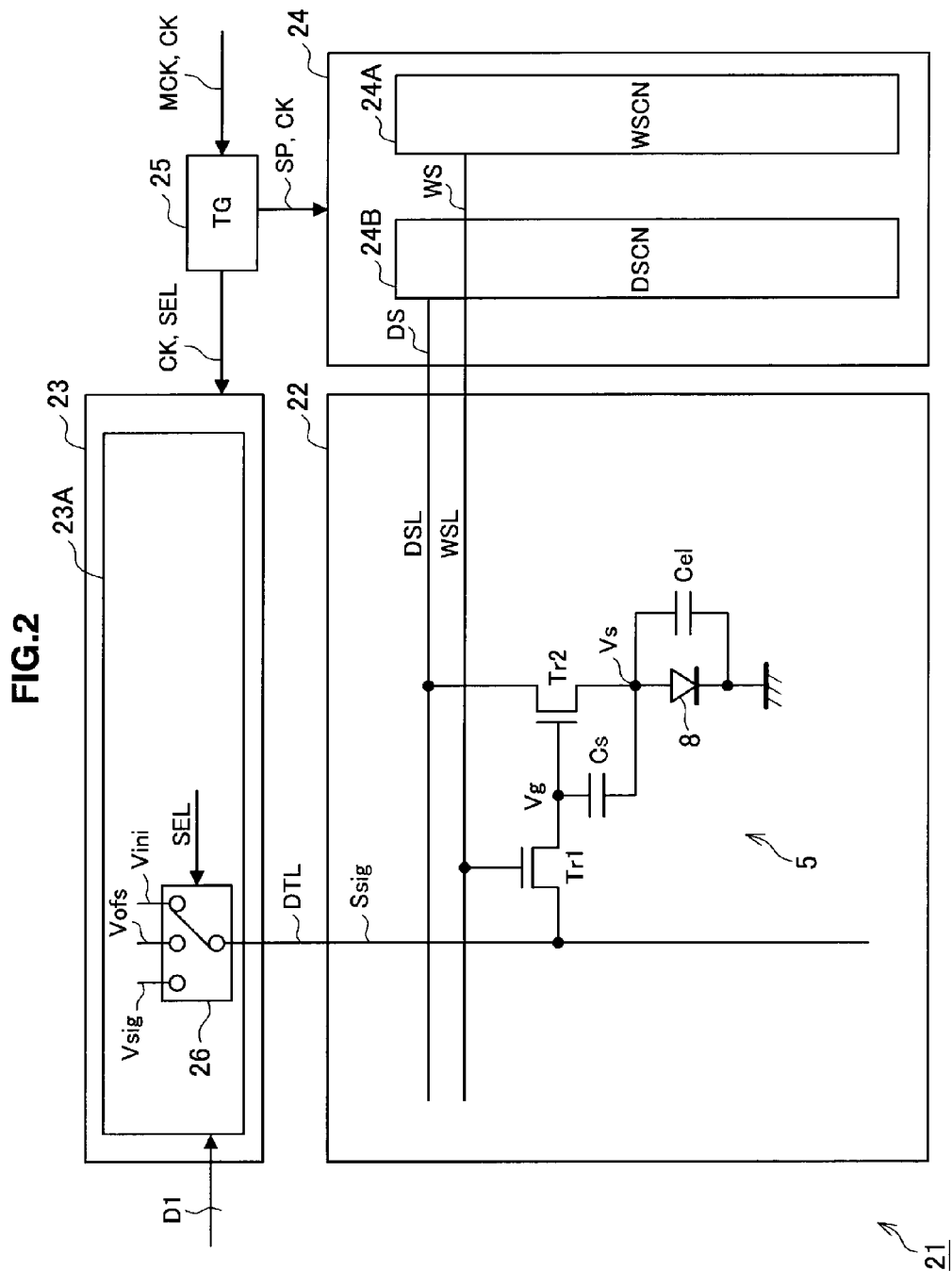
FIG. 2 is a connection diagram showing the image display apparatus according to the first embodiment of the present invention.
Figure 15:
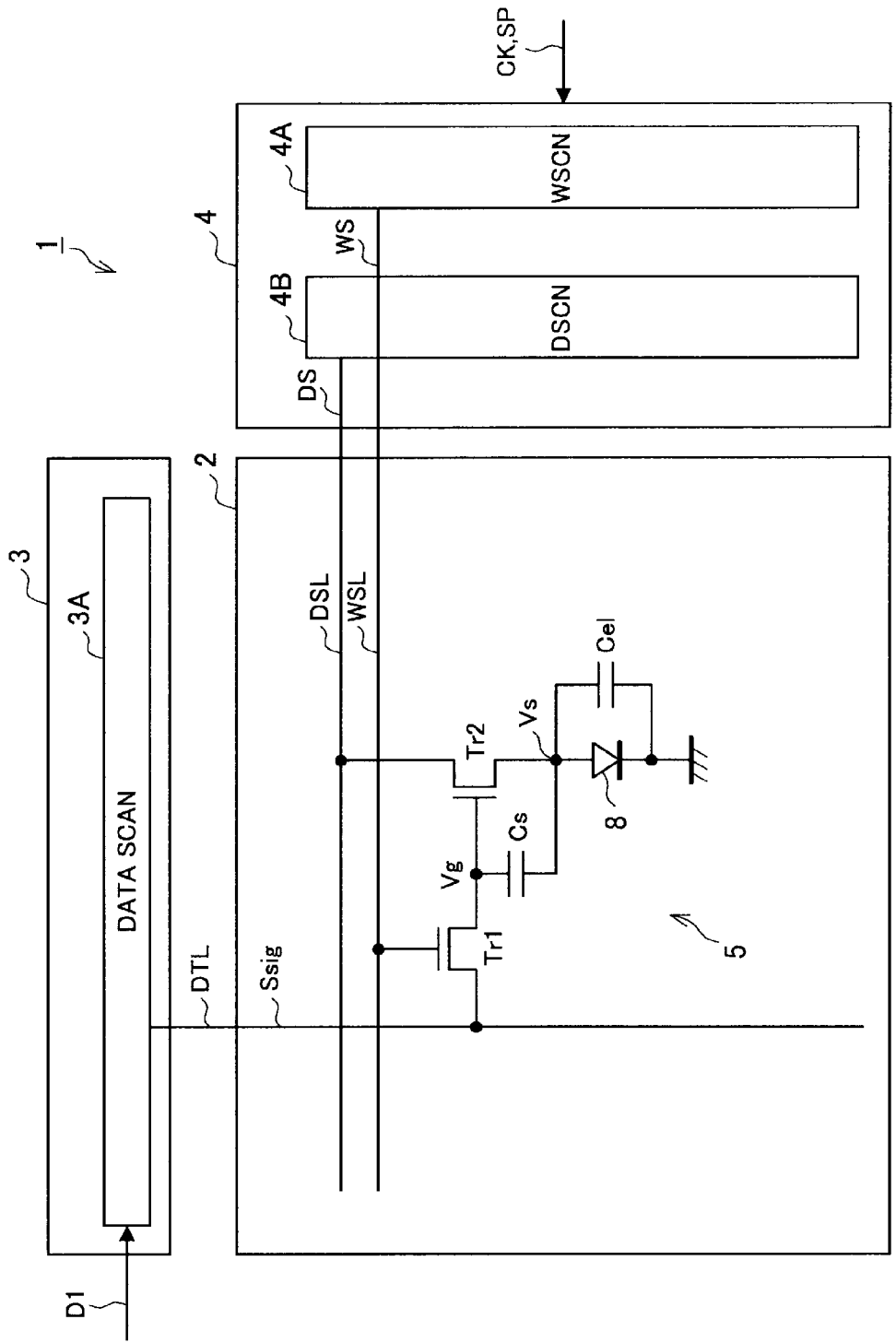
FIG. 15 is a connection diagram showing detailed configuration of the image display apparatus of FIG. 14.
Figure 16:
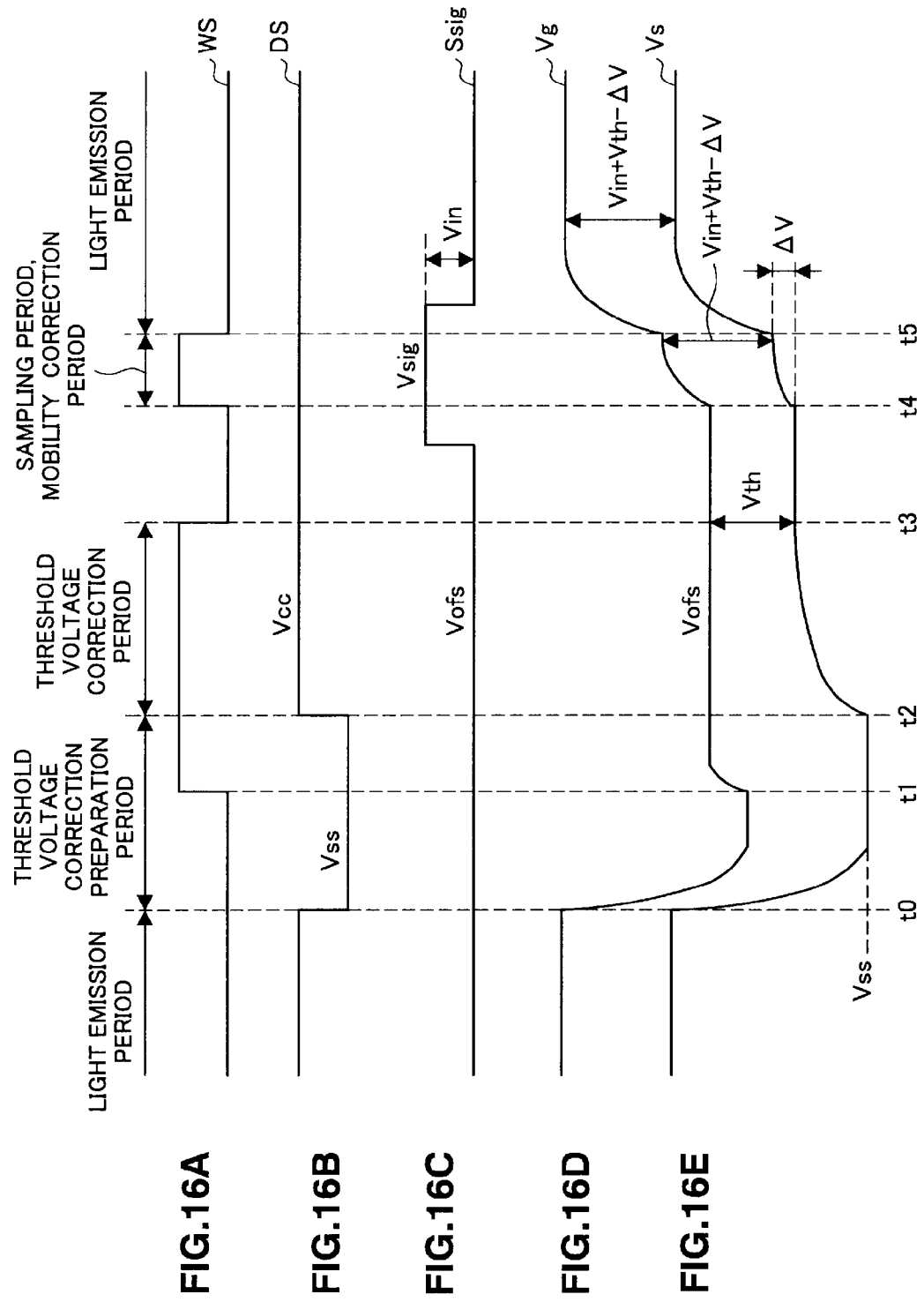
FIGS. 16A to 16E are a time chart describing the operation of the image display apparatus of FIG. 14.
Figure 17:
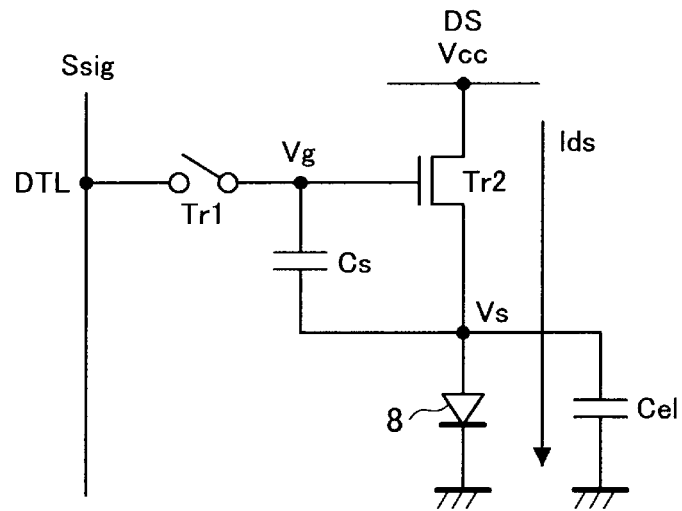
FIG. 17 is a connection diagram describing the operation of the image display apparatus of FIG. 14.
Figure 18:
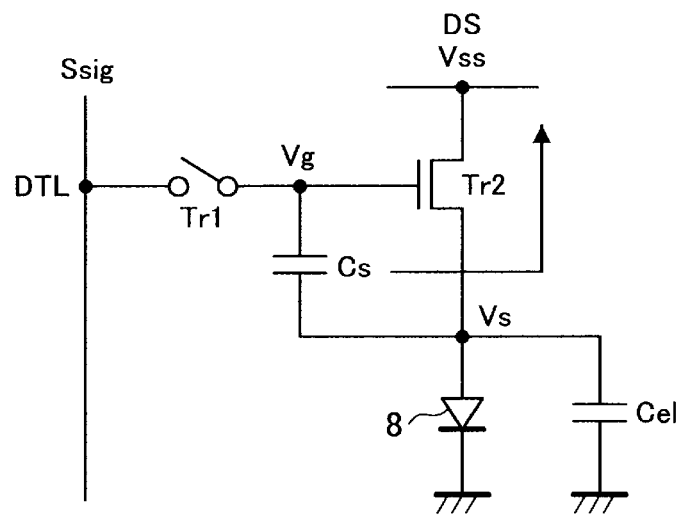
FIG. 18 is a connection diagram providing the description following FIG. 17.
Figure 19:
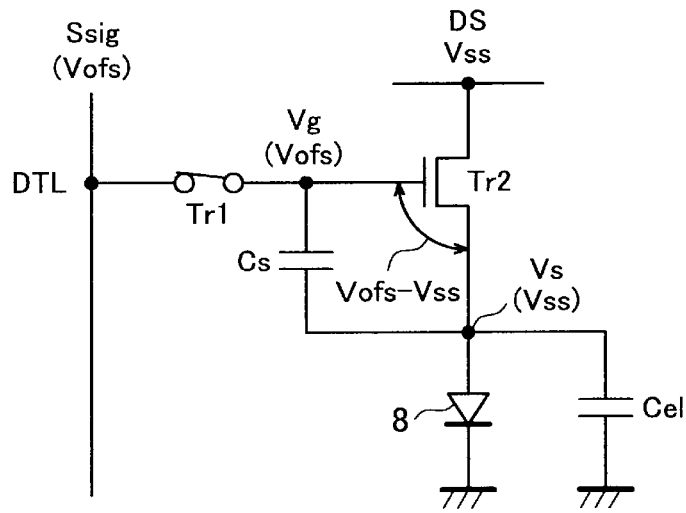
FIG. 19 is a connection diagram providing the description following FIG. 18.
Figure 20:
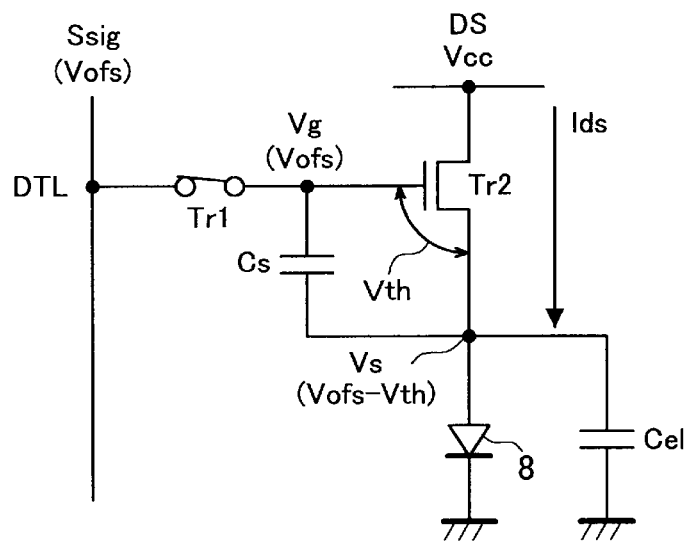
FIG. 20 is a connection diagram providing the description following FIG. 19.
Figure 21:
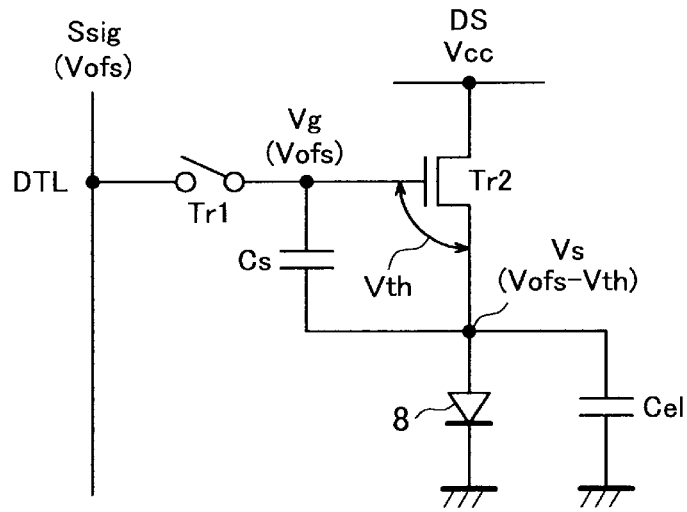
FIG. 21 is a connection diagram providing the description following FIG. 20.
Figure 22:
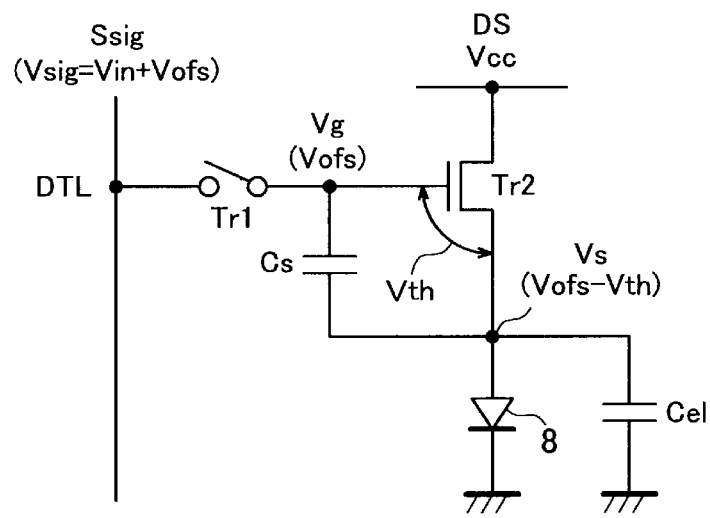
FIG. 22 is a connection diagram providing the description following FIG. 21.
Figure 23:
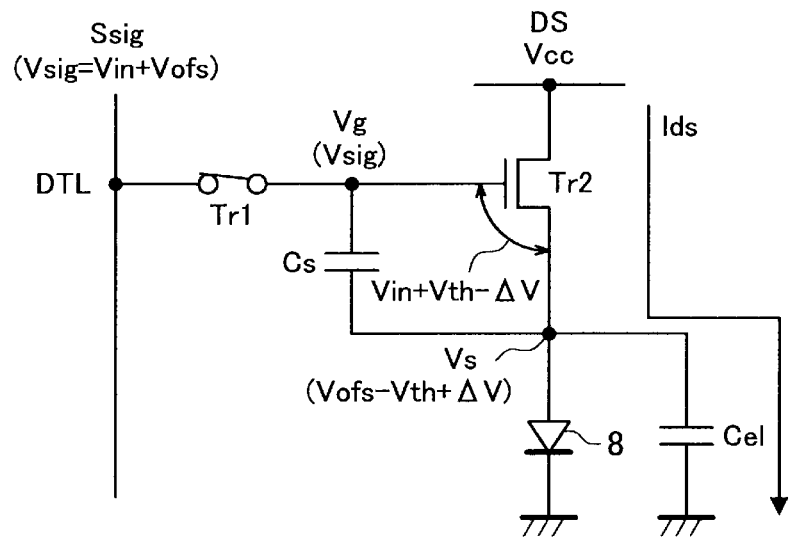
FIG. 23 is a connection diagram providing the description following FIG. 22.
Figure 24:
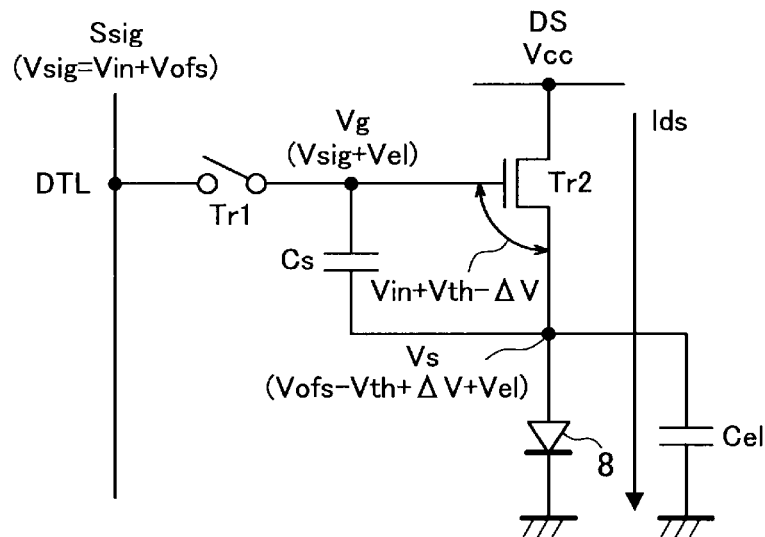
FIG. 24 is a connection diagram providing the description following FIG. 23.

FIG. 2 is a block diagram showing an image display apparatus according to a first embodiment of the present invention comparison with FIG. 15. The image display apparatus 21 is configured the same as the image display apparatus 1 of FIG. 15 other than that the configurations of the signal line drive circuit 23 and the scanning line drive circuit 24 are different. Therefore, the configuration same as the image display apparatus of FIG. 15 are denoted with corresponding reference numbers, and redundant description will be omitted.

The image display apparatus 21 is formed with a display unit 22 by arranging the pixel circuit in a matrix form on the insulating substrate made of glass and the like, where the signal line drive circuit 23 and the scanning line drive circuit 24 are arranged at the periphery of the display unit 22 on the insulating substrate. The display unit 22 is configured the same as the display unit 2 other than that the layout on the glass substrate is different.

The signal line drive circuit 23 outputs the signal line drive signal Ssig to the signal line DTL arranged on the display unit 22. In other words, the signal line drive circuit 23 sequentially latches the image data D1 input in a raster scanning order and allocates the image data D1 to the signal line DTL, and then performs the digital-analog conversion process to generate the tone voltage Vin in a data scan circuit 23A. The data scan circuit 23A adds the variation correction fixed voltage Vofs to the tone voltage Vin and generates the tone setting voltage Vsig(=Vin+Vofs).

The data scan circuit 23A outputs the tone setting voltage Vsig, the variation correction fixed voltage Vofs, and light-off reference voltage Vini sequentially and cyclically to the signal line DTL by a selector 26 that sequentially switches the contacting point by a selector control signal SEL output from a timing generator 25 (see FIG. 3D). The light-off reference voltage Vini is a reference voltage for stopping the light emission of the pixel circuit 5, and is a voltage sufficiently lower than the variation correction fixed voltage Vofs. Specifically, the light-off reference voltage Vini is a voltage of lower than or equal to a voltage Vcath+Vthel+Vth in which the threshold voltage Vthel of the organic EL element 8 and the threshold voltage Vth of the drive transistor Tr2 are added to the cathode voltage Vcath of the organic EL element 8. The image display apparatus 1 sets the tone of each pixel circuit 5 in a so-called line sequential manner.

The scanning line drive circuit 24 processes a predetermined sampling pulse SP with a clock CK to generate a write signal WS and a drive signal DS in a write scan circuit (WSCN) 24A and a drive scan circuit (DSCN) 24B, and outputs the write signal WS and the drive signal DS to the corresponding scanning lines WSL and DSL.

Figure 3:
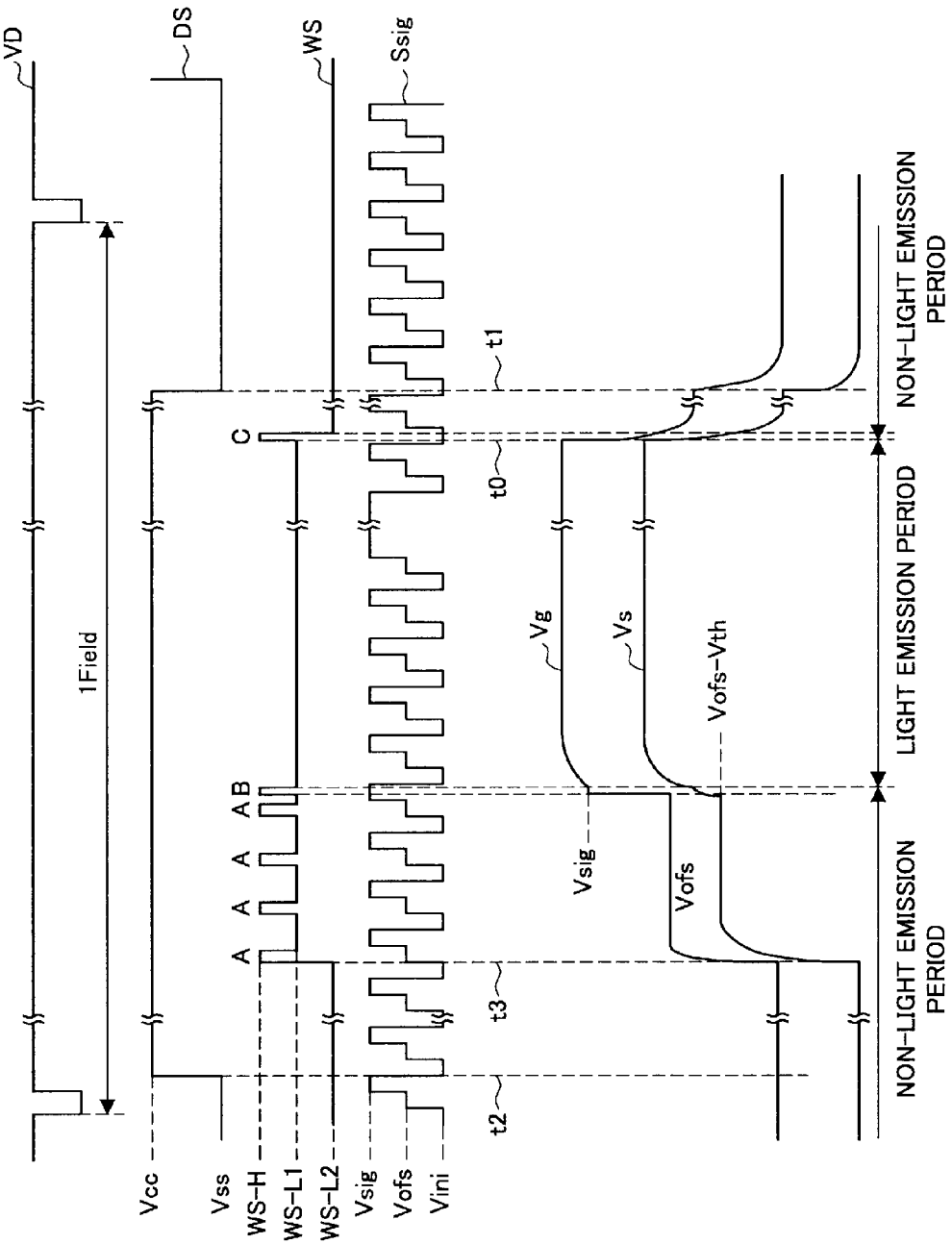
FIGS. 3A to 3F are a time chart describing the operation of a pixel circuit in the image display apparatus of FIG. 2.

FIG. 3 is a timing chart describing the operation of the pixel circuit 5 by the drive signals Ssig, WS, and DS, in comparison to FIG. 25. The pixel circuit 5 has a write transistor Tr1 set to the OFF state by the write signal WS (FIGS. 3A and 3C) and the power supply voltage Vcc supplied to the drive transistor Tr2 by the power supply drive signal DS (FIG. 3B during the light emission period. As a result, the pixel circuit 5 light emits the organic EL element 8 with the drive current Ids corresponding to the gate-source voltage Vgs (FIGS. 3E and 3F) of the drive transistor Tr2 or the inter-terminal voltage of the retention capacity Cs during the light emission period.

In the pixel circuit 5, the write signal WS is raised and the write transistor Tr1 is set to the ON state, and the inter-terminal voltage of the retention capacity Cs is set to the light-off reference voltage Vini at time point t0 when the light emission period ends. The pixel circuit 5 thus reduces the inter-terminal voltage of the retention capacity Cs to lower than or equal to the threshold voltage Vth of the drive transistor Tr2, and stops the drive of the organic EL element 8 by the drive transistor Tr2.

Subsequently, in the pixel circuit 5, the power supply drive signal DS falls to a predetermined fixed voltage Vss at a predetermined time point t1 (FIG. 3B). Thus, the accumulated charges on the organic EL element 8 side end of the retention capacity Cs flow out to the scanning line through the drive transistor Tr2 in the pixel circuit 5. As a result, in the pixel circuit 5, the source voltage Vs of the drive transistor Tr2 reduces to substantially the voltage Vss (FIG. 3F), and the gate voltage Vg of the drive transistor Tr2 lowers in conjunction with the reduction of the source voltage Vs (FIG. 3E). The pixel circuit 5 thus has the source side end voltage of the retention capacity Cs set in relation to the preparation process of the threshold voltage correction process of the drive transistor Tr2.

The power supply drive signal DS then falls to the power supply voltage Vcc at the subsequent predetermined time point t2 in the pixel circuit 5 (FIG. 3B). Thereafter, the pixel circuit 5 has the write transistor Tr1 switched to the ON state by the write signal WS during the period in which the drive signal Ssig of the signal line DTL is set to the threshold value voltage correction fixed voltage Vofs (FIGS. 3C and 3D). The pixel circuit 5 thus has the gate side end voltage of the retention capacity Cs set and the inter-terminal voltage of the retention capacity Cs set to the voltage of greater than or equal to the threshold voltage Vth of the drive transistor Tr2 in relation to the preparation process of the threshold voltage correction process of the drive transistor Tr2. When the inter-terminal voltage of the retention capacity Cs rises to the voltage of greater than or equal to the threshold voltage Vth of the drive transistor Tr2, the threshold voltage correction process of the drive transistor Tr2 is executed in the pixel circuit 5. In the following description, the period of executing the threshold voltage correction process of the drive transistor Tr2 is indicated with symbol A. Therefore, in the example of FIG. 3, the period of executing the threshold voltage correction process of the drive transistor Tr2 is executed in four periods.

The pixel circuit 5 subsequently has the write transistor Tr1 set to the ON state for a constant period in a period in which the drive signal Ssig of the signal line DTL is set to the corresponding tone setting voltage Vsig (FIG. 3C). As a result, the pixel circuit 5 corrects the variation of the mobility μ of the drive transistor Tr2 to set the inter-terminal voltage of the retention capacity Cs to the voltage corresponding to the tone setting voltage Vsig, and starts the light emission period. The pixel circuit 5 then can drive the organic EL element 8 while effectively avoiding the variation of the threshold voltage Vth of the drive transistor Tr2, and can prevent degradation in image quality due to variation of the light emission luminance of the organic EL element 8. A period of correcting the variation of the mobility and setting the tone is indicated with symbol B. A period of setting the light-off reference voltage Vini is indicated with symbol C.

In the example of FIG. 3, the image display apparatus 21 starts the threshold voltage correction process, and then holds, until setting the light-off reference voltage Vini, the L level voltage WS-L1 of the write signal WS to a voltage higher than the L level voltage WS-L2 in a period other than the above period. The image display apparatus 21 thus prevents leakage current of the write transistor Tr1, and prevents fluctuation of the inter-terminal voltage of the retention capacity Cs by the leakage current.

In place of the light-off reference voltage Vini, the write signal WS may be ON operated to start the non-light emission period at the timing of the variation correction fixed voltage Vofs. In this case, the light-off reference voltage Vini is omitted, and the drive signal Ssig of the signal line DTL may be generated by the repetition of the tone setting voltage Vsig and the variation correction fixed voltage Vofs.

[Unit Drive]

In this embodiment, the light emission period and the non-light emission period respectively starts by the setting of the terminal voltage of the retention capacity Cs in the pixel circuit 5. Therefore, the process of dropping the power supply drive signal DS to the voltage Vss and setting the source side end voltage of the retention capacity Cs can be executed at a desired time point insofar as the threshold voltage correction process is not influenced in the non-light emission period.

The image display apparatus 21 is common to a plurality lines that continues the control of the drain voltage of the drive transistor Tr2, and drives each pixel circuit by a so-called unit drive method. The unit drive method is a method of commonly using the drive of the pixel circuit 5 arranged on the display unit 22 with a plurality of successive lines.

Figure 4:
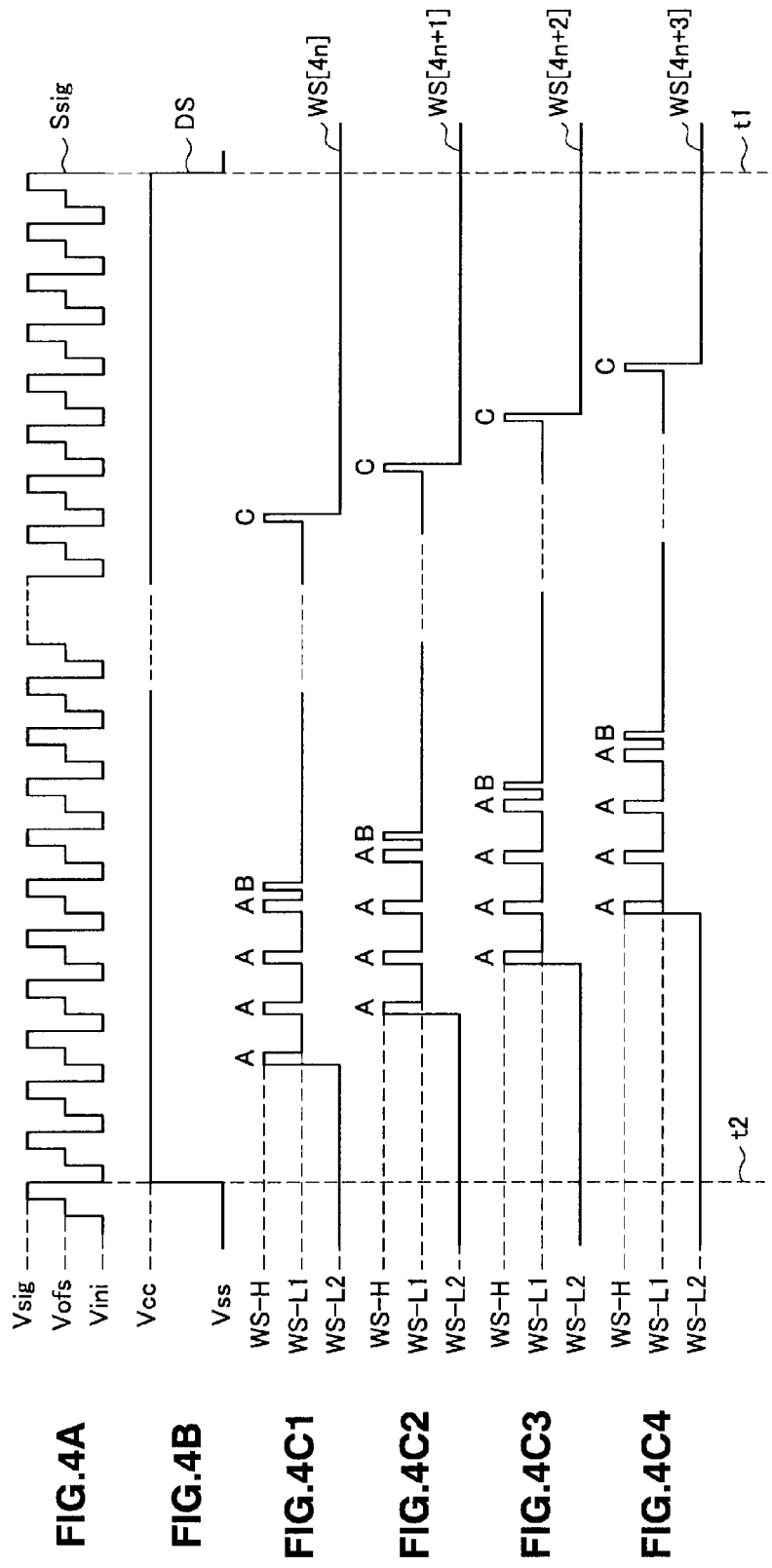

In other words, in comparison to FIG. 3, the image display apparatus 21 groups the pixel circuit 5 configuring the display unit 22 by units of four lines, to commonly use the power supply drive signal DS in each group, as shown in FIG. 4. In FIG. 4, the successive lines are represented as 4n, 4n+1, 4n+2, 4n+3 (n is an integer) in correspondence to the grouping by units of four lines, and the correspondence relationship of the power supply drive signal DS and the write signal WS is shown. In the following, the group formed by grouping is referred to as unit.

The scanning line drive circuit 24 generates write signals WS[4n], WS[4n+1], WS[4n+2], WS[4n+3] so as to be sequentially delayed by one horizontal scanning period in the successive lines, independent from the unit (FIGS. 4B, 4(C1), 4(C2), 4(C3), and 4(C4)). The image display apparatus 21 thereby sets the tone of each pixel circuit 5 in line sequential manner.

The scanning line drive circuit 24 generates the power supply drive signal DS for every unit. In other words, in the unit, the power supply drive signal DS is raised to the power supply voltage Vss before a constant time from the timing the write signal WS is raised the earliest (time point t2). After lastly setting the light-off reference voltage Vini, the power supply drive signal DS falls to the voltage Vss after a constant time has elapsed (time point t1). In the successive units, the drive signal DS is generated by sequentially delaying by four horizontal scanning periods corresponding to the number of lines configuring one unit.

[Layout of Wiring Pattern]

In the unit drive method, the power supply drive signal DS is commonly used among a plurality of successive lines, and thus the number of power supply drive signals DS generated in the scanning line drive circuit 24 can be reduced. Therefore, the configuration of the scanning line drive circuit 24 can be simplified.

In the unit drive method, one power supply drive signal DS output from the scanning line drive circuit 24 can be allocated to a plurality of lines configuring one unit to drive the same. Therefore, the number of terminals of the scanning line drive circuit 24 can be reduced and the configuration can be simplified.

However, when allocating one power supply drive signal DS output from the scanning line drive circuit 24 to a plurality of lines configuring one unit, a region provided for the allocation of the power supply drive signal DS while collecting the scanning line of a plurality of lines configuring one unit is desired. In other words, FIG. 5 is a plan view showing a configuration in which a scanning line coupling region is arranged and the scanning lines of a plurality of lines configuring one unit is collected to one in the scanning line coupling region on the premise of the arrangement of the wiring pattern in the image display apparatus of the related art, in comparison to FIG. 27.

When collecting the scanning lines of a plurality of lines in one wiring pattern, the current worth the plurality of lines flows to the wiring pattern. Therefore, it is to be created with a sufficient line width to prevent voltage drop, and to prevent cross talk. Specifically, when the line width of the power supply scanning line DSL is W and n lines are collected, the line width of n×W is at least necessary. Therefore, the scanning line coupling region desirably has at least a width of n×W. As a result, narrowing the frame becomes difficult in this case.

Figure 5:
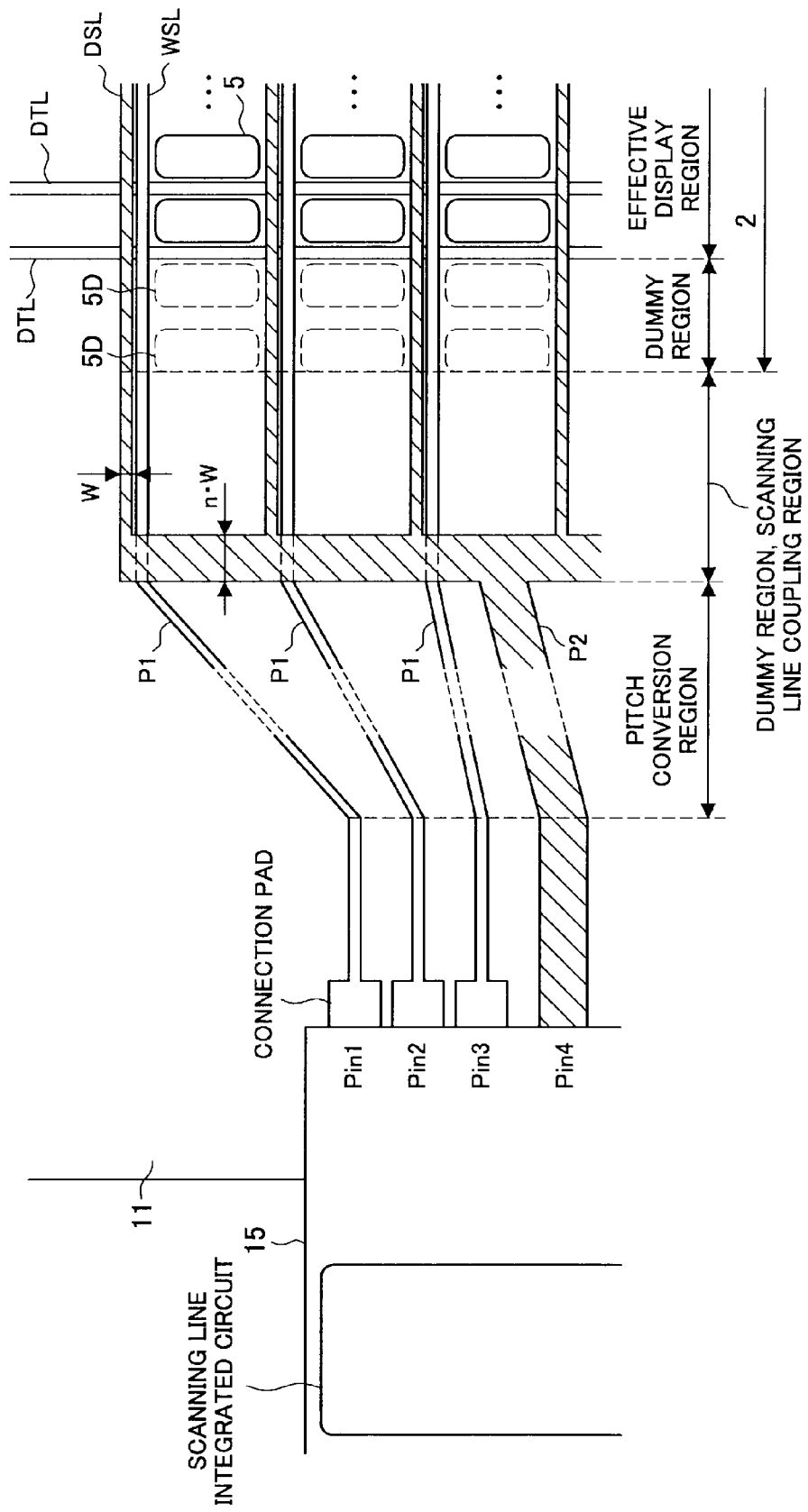
FIG. 5 is a plan view describing the image display apparatus of FIG. 1.

The image display apparatus 21 has all or part of the scanning line coupling region arranged in the dummy region of the display unit 22, as shown in FIG. 1 in comparison to FIG. 5. In other words, the image display apparatus 21 has the signal line integrated circuit and the scanning line integrated circuit 28 configuring the signal line drive circuit 23 and the scanning line drive circuit 24 connected by way of the flexible wiring substrate 29 after forming the display unit 22 on the insulating substrate 11 or the glass substrate, similar to the description on FIG. 27.

The effective display region is formed with a first wiring configuring the signal line DTL, the gate electrode of the write transistor Tr1, the gate electrode of the drive transistor Tr2, the substrate side electrode of the retention capacity Cs, and the like in the step of forming the display unit 22 on the insulating substrate 11. The effective display region is then sequentially formed with the gate insulation layer of the write transistor Tr1 and the drive transistor Tr2, the amorphous silicon layer, and the like, and then the amorphous silicon layer is subjected to the annealing process by the irradiation of the laser beam. Thereafter, the effective display region is formed with a second wiring configuring the scanning lines WSL and DSL, the drain electrode and the source electrode of the write transistor Tr1, the drain electrode and the source electrode of the drive transistor Tr2, the opposing side electrode of the retention capacity Cs, and the like. After the organic EL element is formed in each pixel circuit 5, the entire insulating substrate 11 is formed by being sealed by the glass substrate.

The dummy region is arranged along one side of the effective display region on the side at least the scanning line integrated circuit 28 is arranged. The dummy pixel circuit 5D is arranged in the dummy region. In the present embodiment, the dummy pixel circuit 5D is arranged to continue from the effective display region at the same pixel pitch as the pixel circuit 5 arranged in the effective display region.

The dummy pixel circuit 5D is used for prior positioning adjustment process, laser beam amount adjustment process, and the like when performing annealing process on the pixel circuit 5 arranged in the effective display region. Thus, the dummy pixel circuit 5D is formed with a configuration necessary for the positioning adjustment process and the light amount adjustment process excluding the configuration that can be used to form the scanning line coupling region of the configuration of the pixel circuit 5.

More specifically, the dummy pixel circuit 5D is formed by arranging the amorphous silicon layer provided for the annealing process with the same layout as the pixel circuit 5 arranged in the effective image display region. The dummy pixel circuit 5D is formed simultaneously with the pixel circuit 5 in the step of forming the pixel circuit 5 of the effective display region.

The dummy region is formed with a wiring pattern P1 for connecting the scanning line WSL of the write signal WS to the integrated circuit 28 and a wiring pattern P2 for collectively connecting the scanning lines DSL of the power supply drive signal DS to the integrated circuit 28 by the second wiring arranged in the pixel circuit 5. The image display apparatus 21 has the scanning line coupling region arranged in the dummy region. The wiring pattern P1 of the write signal WS intersects the wiring pattern of the power supply drive signal DS, where the dummy region is formed with the wiring pattern P1 of the write signal WS by the first wiring limited to the intersecting region.

The image display apparatus 21, on the other hand, has a similar dummy region arranged along one side of the effective display region on the side arranged with the signal line integrated circuit. The image display apparatus 21 has all or part of the pitch conversion region of the wiring pattern from the signal line integrated circuit arranged in the dummy region on the signal line side, and the dummy pixel circuit 5D arranged, similar to the scanning line side.

[Operation of Embodiment]

In the above configuration, in the image display apparatus 21 (FIGS. 2 and 3), the digital-analog conversion process is performed after the sequentially input image data D1 is allocated to the signal line DTL in the signal line drive circuit 23. Thus, the tone voltage Vin instructing the tone of each pixel connected to the signal line DTL is generated for every signal line DTL in the image display apparatus 21. In the image display apparatus 21, the tone voltage Vin is set in a line sequential manner to each pixel circuit 5 configuring the display unit 22 by the drive of the display unit 22 by the scanning line drive circuit 24. In each pixel circuit 5, the organic EL element 8 emits light by the light emission luminance corresponding to the tone voltage Vin. Thus, in the image display apparatus 21, the image corresponding to the image data D1 can be displayed on the display unit 22.

More specifically, the organic EL element 8 is current driven by the drive transistor Tr2 of source-follower circuit configuration in the pixel circuit 5. In the pixel circuit 5, the voltage on the gate side end of the retention capacity Cs arranged between the gate and the source of the drive transistor Tr2 is set to the voltage Vsig corresponding to the tone voltage Vin. Thus, in the image display apparatus 21, the organic EL element 8 emits light by the light emission luminance corresponding to the image data D1 to display the desired image.

However, the drive transistor Tr2 applied to the pixel circuit 5 has a drawback in that the variation of the threshold voltage Vth is large. As a result, in the image display apparatus 21, the light emission luminance of the organic EL element 8 varies due to the variation of the threshold voltage Vth of the drive transistor Tr2 and the image quality degrades if the gate side end voltage of the retention capacity Cs is merely set to the voltage Vsig corresponding to the tone voltage Vin.

In the image display apparatus, the organic EL element 8 side end voltage of the retention capacity Cs reduces by the fall of the power supply drive signal DS beforehand. Thereafter, the gate voltage of the drive transistor Tr2 is set to the threshold voltage correction fixed voltage Vofs through the write transistor Tr1 (FIG. 4). In the image display apparatus 21, the inter-terminal voltage of the retention capacity Cs is set to greater than or equal to the threshold voltage Vth of the drive transistor Tr2. The inter-terminal voltage of the retention capacity Cs is discharged through the drive transistor Tr2. In the image display apparatus 21, the inter-terminal voltage of the retention capacity Cs is set to the threshold voltage Vth of the drive transistor Tr2 beforehand by a series of processes.

Subsequently, in the image display apparatus, the tone setting voltage Vsig in which the fixed voltage Vofs is added to the tone voltage Vin is set to the gate voltage of the drive transistor Tr2. Thus, in the image display apparatus 21, the degradation in the image quality due to the variation of the threshold voltage Vth of the drive transistor Tr2 can be prevented.

During a constant time, the gate voltage of the drive transistor Tr2 is held at the tone setting voltage Vsig while supplying the power to the drive transistor Tr2, so that the degradation in the image quality due to the variation of the mobility of the drive transistor Tr2 can be prevented.

However, it is sometimes difficult to assign a sufficient time to the discharge of the inter-terminal voltage of the retention capacity Cs through the drive transistor Tr2 due to higher resolution, and the like. In this case, the inter-terminal voltage of the retention capacity Cs may not be set to the threshold voltage Vth of the drive transistor Tr2 at satisfactory accuracy in the image display apparatus 21. As a result, the variation of the threshold voltage Vth of the drive transistor Tr2 may not be adequately corrected.

In the present embodiment, the discharge of the inter-terminal voltage of the retention capacity Cs through the drive transistor Tr2 is executed over plural periods. Thus, sufficient time can be assigned to the discharge of the inter-terminal voltage of the retention capacity Cs through the drive transistor tr2, and the variation of the mobility of the drive transistor Tr2 can be sufficiently corrected even in a case of high resolution.

In the image display apparatus 21, the light emission period of each pixel circuit 5 starts by the setting of the inter-terminal voltage of the retention capacity Cs by the mobility variation correction process. In the image display apparatus 21, the inter-terminal voltage of the retention capacity Cs is similarly set using the light-off reference voltage Vini (FIGS. 3 and 4). Thus, in the image display apparatus 21, the light emission period of each pixel circuit 5 is executed by the control of the write signal WS, and the power supply drive signal DS is commonly used among a plurality of lines.

Therefore, the configuration related to the generation of the drive signal DS can be simplified in the image display apparatus 21. More specifically, the configuration of the drive scan circuit 24B can be simplified, and the overall configuration of the image display apparatus 21 can be simplified.

However, if the power supply drive signal DS is commonly used among a plurality of lines, a scanning line coupling region for collecting the scanning lines DSL of a plurality of lines to one is necessary (FIG. 5). As a result, narrower frame becomes difficult to achieve in the image display apparatus 21. In particular, in the image display apparatus, the terminal of the integrated circuit configuring the signal line drive circuit 23 and the scanning line drive circuit 24 is formed by a narrow pitch, which is converted to the pitch of the signal line and the scanning line arranged in the display unit 22 by the pitch conversion region arranged at the periphery of the display unit 22, and thus a region for arranging the wiring pattern of a larger area is necessary at the periphery of the display unit 22.

Thus, in the image display apparatus 21, the scanning line coupling region is arranged in accordance with the dummy region arranged in the display unit 22 on the side arranged with the scanning line integrated circuit 28 (FIG. 1). Thus, in the image display apparatus 21, the wiring pattern on the insulating substrate can be efficiently arranged compared to the related art, and the frame can be narrowed in an extending direction of the scanning line. The area of the insulating substrate 11 of the display unit 22 can be reduced in the horizontal direction, and the overall shape can be miniaturized.

In side arranged with the signal line drive circuit, the pitch conversion region is arranged in accordance with the dummy region arranged in the similar display unit 22 (FIG. 1). Thus, in the image display apparatus 21, the wiring pattern on the insulating substrate can be efficiently arranged and the frame can be narrowed compared to the related art in an extending direction of the signal line. The area of the insulating substrate 11 of the display unit 22 can also be reduced in a vertical direction, and the overall shape can be miniaturized.

Specifically, in the image display apparatus 21, a dummy region is formed by arranging the pixel circuit 5 with the layout of the pixel circuit 5 and arranging the dummy pixel circuit 5D to equalize the thermal profile in performing the annealing process on the pixel circuit 5. The scanning line coupling region and the pitch conversion region are formed by the first wiring and the second wiring of when forming the pixel circuit 5. Therefore, the wiring pattern on the insulating substrate can be efficiently arranged and the frame can be narrowed compared to the related art without changing the steps.

[Effects of the Embodiment]

According to the configuration described above, on the premise of the unit drive method, the wiring pattern on the insulating substrate can be efficiently arranged compared to the related art in the extending direction of the scanning line by arranging all or part of the scanning line coupling region in the dummy region for arranging the dummy pixel.

More specifically, the pixel circuit is configured by at least the light emitting element, the write transistor, the drive transistor, and the retention capacity, and the image display apparatus is specifically configured by alternately repeating the light emission period and the non-light emission period, so that the wiring pattern on the insulating substrate can be efficiently arranged compared to the related art in the extending direction of the scanning line.

With regards to the power supply scanning line, the wiring pattern on the insulating substrate can be efficiently arranged compared to the related art by starting the light emission period and the non-light emission period through setting of the terminal voltage of the retention capacity through the signal line.

In the non-light emission period, the inter-terminal voltage of the retention capacity is set to a voltage of greater than or equal to the threshold voltage of the drive transistor, and the inter-terminal voltage of the retention capacity is set to the threshold voltage of the drive transistor by the discharge through the drive transistor, so that degradation in image quality due to variation in the threshold voltage of the derive transistor can be effectively avoided.

In this case, the pixel circuit can be configured with a simple configuration by setting the inter-terminal voltage of the retention capacity to the voltage of greater than or equal to the threshold voltage of the drive transistor through the power supply drive signal and the signal line drive signal of the drive transistor, so that the wiring pattern on the insulating substrate can be efficiently arranged compared to the related art.

The wiring pattern on the insulating substrate can be efficiently arranged compared to the related art in the extending direction of the signal line by arranging the pitch conversion region in the dummy region for arranging the dummy pixel.

More specifically, the pixel circuit is configured by at least the light emitting element, the write transistor, the drive transistor, and the retention capacity, and the image display apparatus is specifically configured by alternately repeating the light emission period and the non-light emission period, so that the wiring pattern on the insulating substrate is efficiently arranged compared to the related art in the extending direction of the signal line.

Second Embodiment

Figure 6:
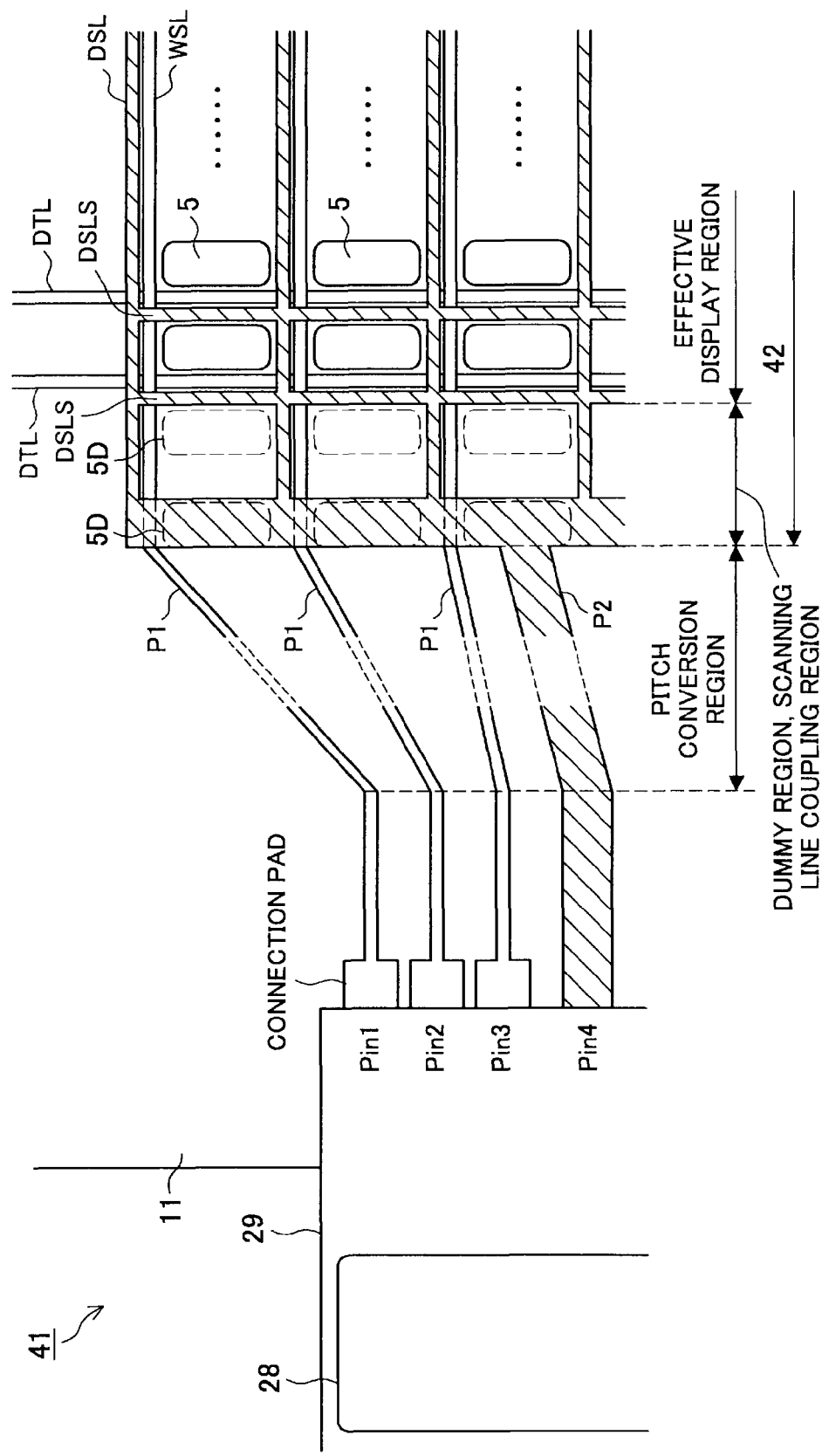
FIG. 6 is a plan view showing an image display apparatus according to a second embodiment of the present invention.

FIG. 6 is a plan view showing an image display apparatus according to a second embodiment of the present invention in comparison to FIG. 1. The image display apparatus 41 has a short-circuit wiring pattern DSLS arranged in each pixel circuit 5, where the short-circuit wiring pattern DSLS forms the wiring pattern of the drive signal DS to a field shape for every unit in the display unit 42. The image display apparatus 41 of the present embodiment is configured the same as the image display apparatus 21 according to the first embodiment other than that the configuration related to the wiring pattern is different.

Figure 7:
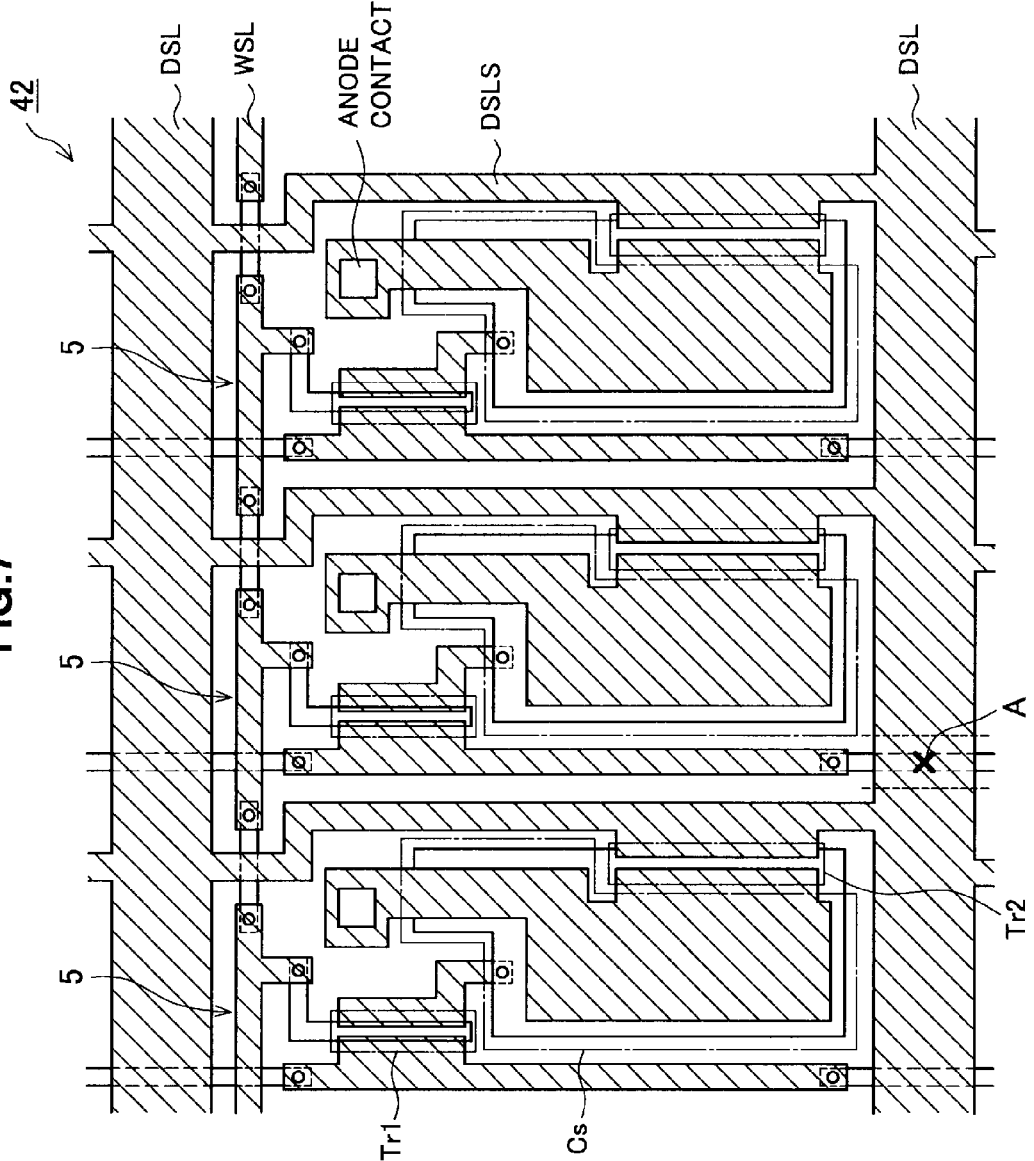
FIG. 7 is a plan view showing a layout of a pixel circuit in the image display apparatus of FIG. 6.

In other words, FIG. 7 is a plan view showing in detail the pixel circuit 5 of the image display apparatus 41. The display unit 42 is arranged with the scanning line DSL of the drive signal DS at above and below each pixel circuit 5 with respect to the pixel circuit 5 of n lines configuring one unit. Therefore, n+1 scanning lines DSL are arranged with respect to one unit. The display unit 42 is arranged with the short-circuit wiring pattern DSLS for short circuiting the upper and lower scanning lines DSL in the pixel circuit 5 continuing in the horizontal direction. The wiring pattern DSLS is formed by extending the wiring pattern for connecting the power supply scanning line DSL to the drain of the drive transistor Tr2.

Thus, in the present embodiment, the resistance value of the scanning line DSL is significantly reduced with regards to the power supply drive signal DS, and the occurrence of cross talk significantly reduces. Repair can be easily carried out even if the scanning line DSL of the power supply drive signal DS is short circuited with the signal line DTL of the lower layer. In other words, in FIG. 7, when the scanning line DSL and the signal line DEL are short circuited at the region indicated with symbol A, the short circuit of the scanning line DSL and the signal line DTL can be repaired by cutting the scanning line DSL at before and after the relevant region, as shown with a broken line. In this case, the drive signal DS is provided through the scanning line DSL and the short-circuit wiring pattern DSLS arranged on the upper side of the pixel circuit 5 for the pixel circuit 5 after the cut region.

According to such embodiment, the occurrence of cross talk can be significantly reduced and the short-circuit accident can be easily repaired by forming the wiring pattern of the drive signal DS to a field shape for every unit.

Third Embodiment

Figure 8:
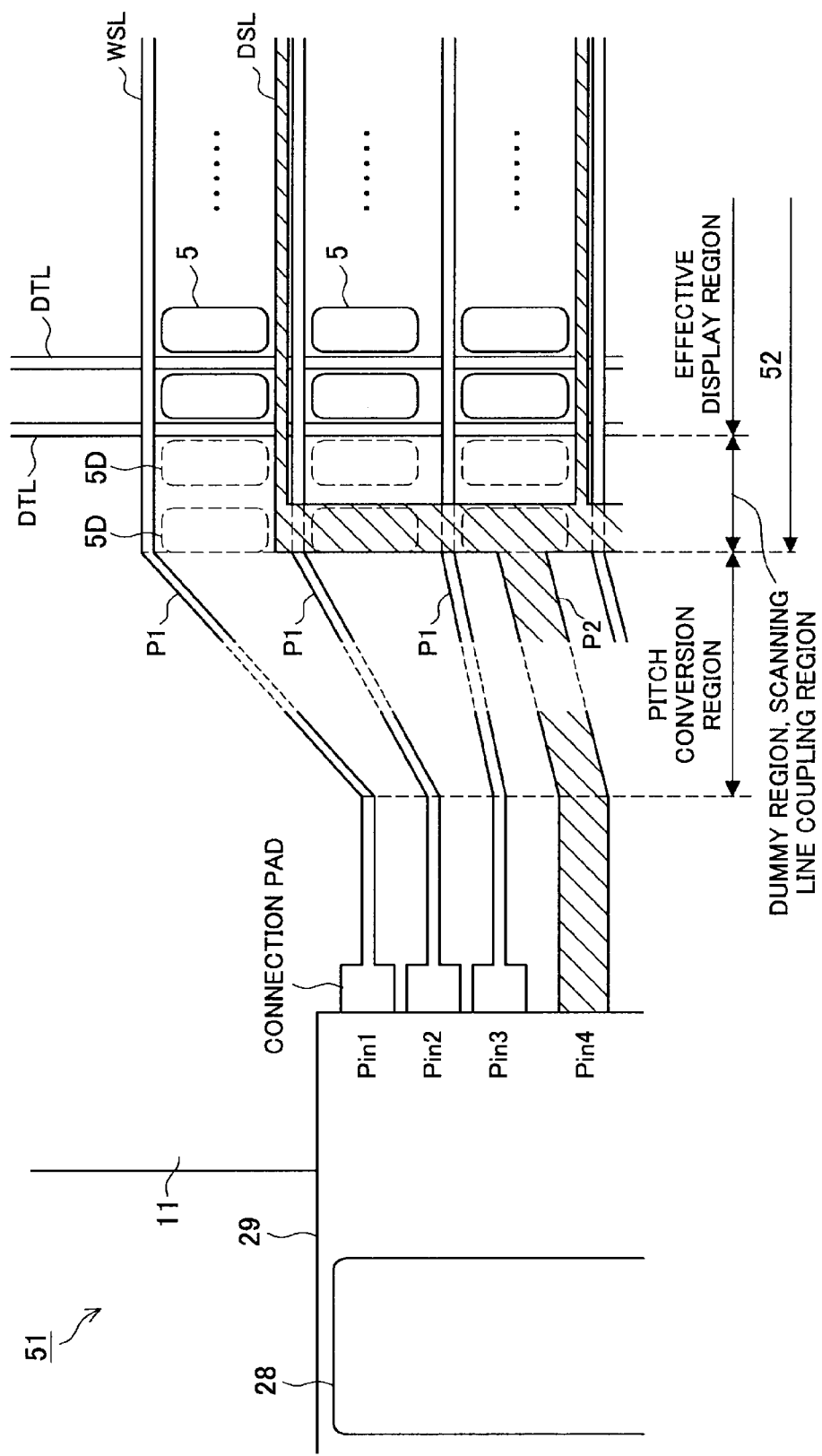
FIG. 8 is a plan view showing an image display apparatus according to a third embodiment of the present invention.

FIG. 8 is a plan view showing an image display apparatus according to the third embodiment of the present invention in comparison to FIG. 1. The image display apparatus 51 is formed with one unit by even-numbered lines. The scanning line DSL of the power supply drive signal DS is arranged only between the odd-numbered line and the following even-numbered line, where the power supply drive signal DS is provided to the pixel circuit 5 arranged above and below the scanning line DSL by the scanning line DSL of the power supply drive signal DS arranged between the lines. Thus, in the image display apparatus 51, the scanning line DSL is commonly used with the odd-numbered line and the following even-numbered line. The image display apparatus 51 of the present embodiment is configured the same as the image display apparatus 21 of the first embodiment other than that the configuration related to the scanning line is different.

The image display apparatus 51 of the present embodiment thus reduces the number of scanning lines DSL, and efficiently arranges the wiring pattern on the insulating substrate compared to the related art even in the direction orthogonal to the extending direction of the scanning line DSL. The image display apparatus 51 thus can enhance the yield by the defect of the scanning line DSL. Margin can be provided to the layout of the pixel circuit, so that the degree of freedom in design can be significantly improved. Furthermore, the configuration of the scanning line coupling portion can be simplified.

Figure 9:
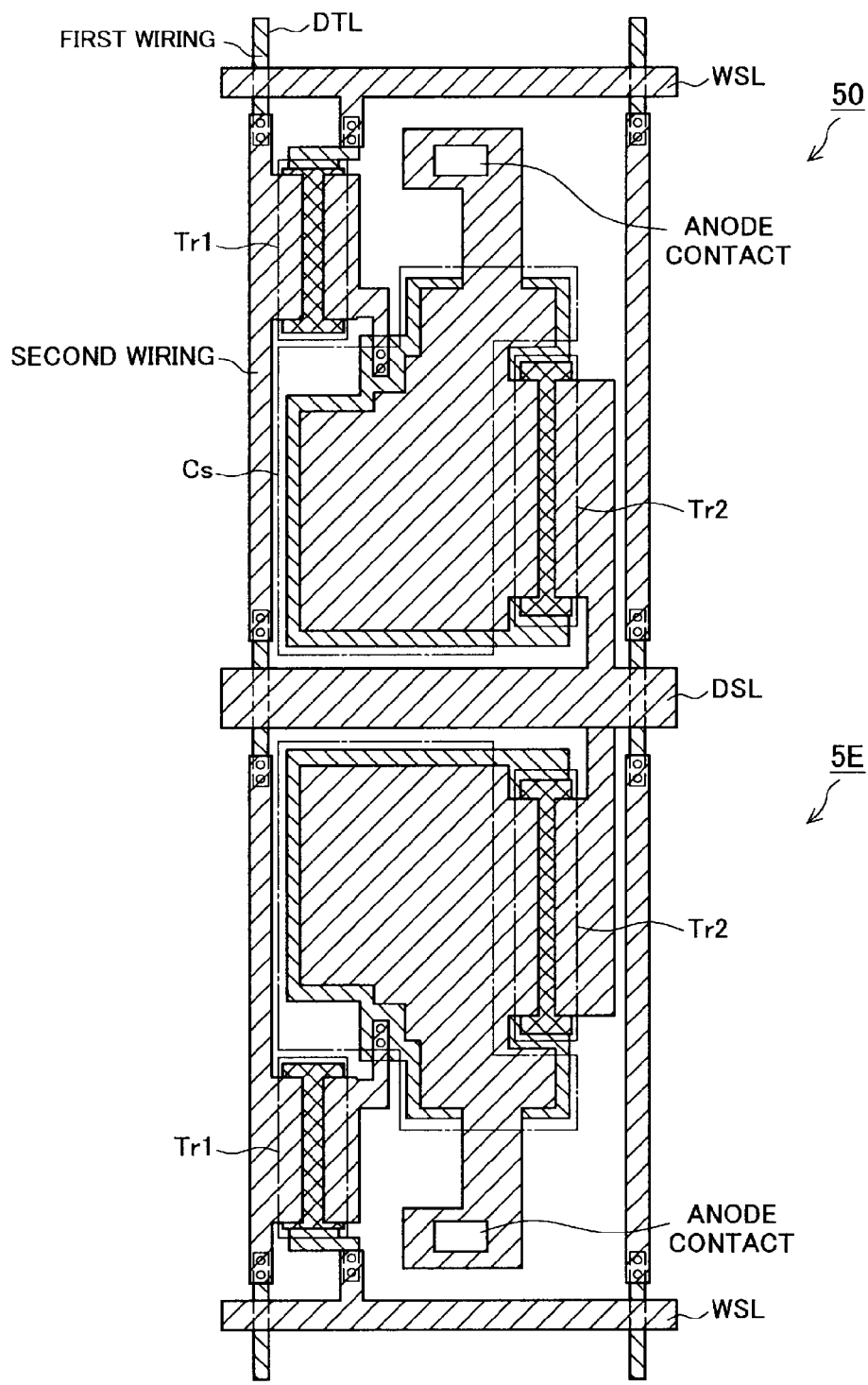
FIG. 9 is a plan view describing the layout of the pixel circuit of FIG. 8.
Figure 10:
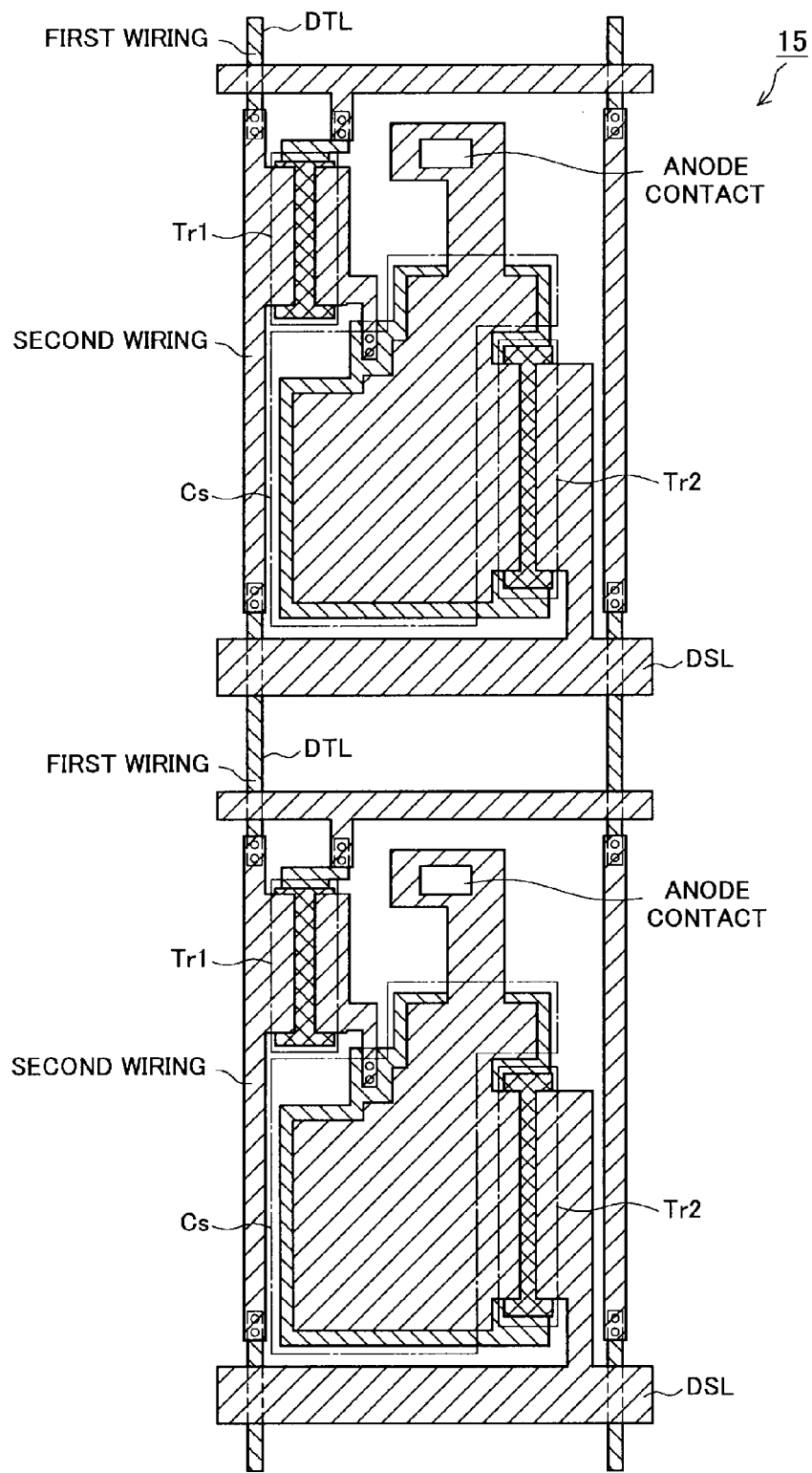
FIG. 10 is a plan view showing a layout of a pixel circuit in the image display apparatus of FIG. 6.
Figure 11:
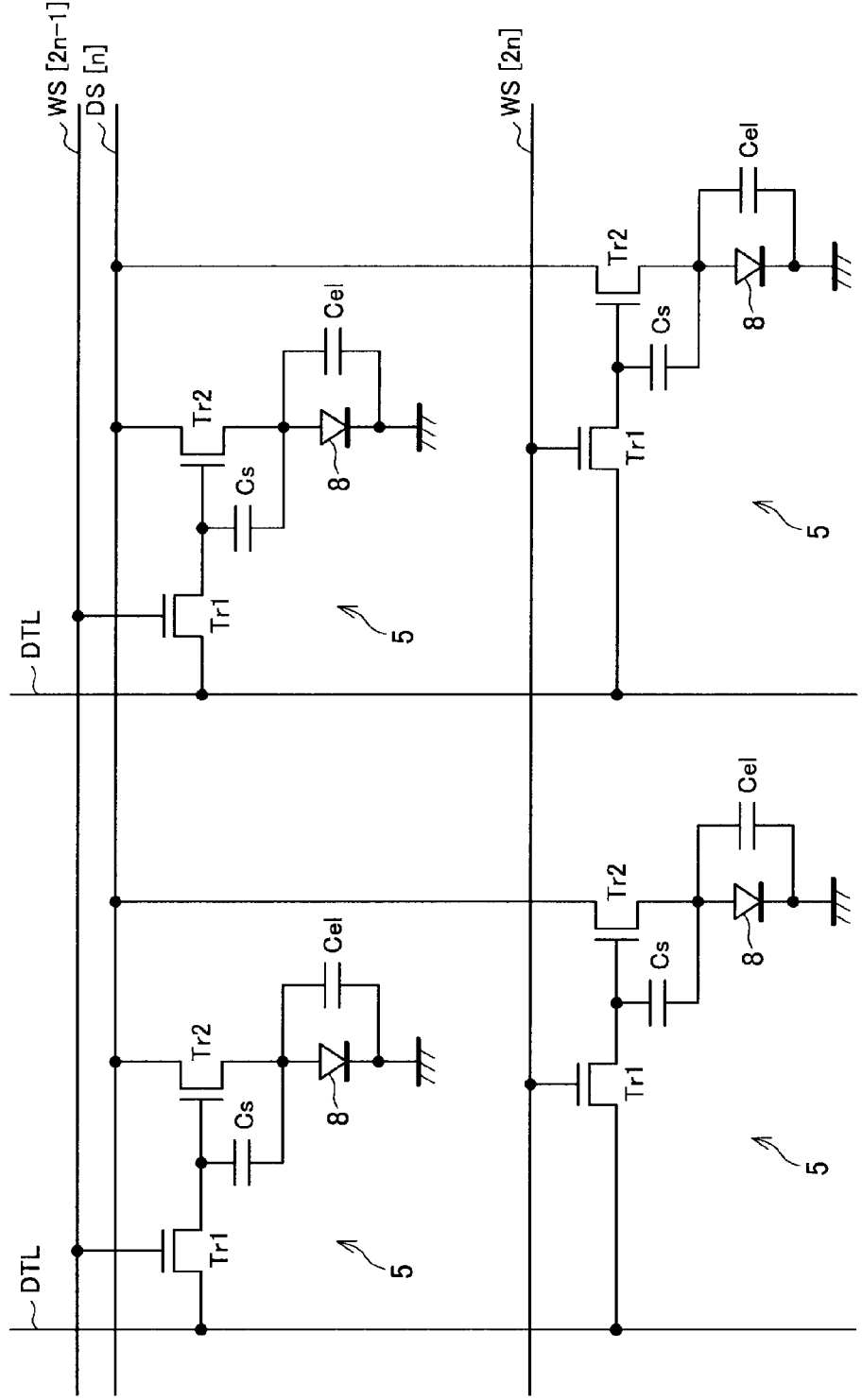
FIG. 11 is a connection diagram in the layout of FIG. 9.

FIG. 9 is a plan view showing in detail the pixel circuit 5O of odd-numbered line and the pixel circuit 5E of the following even-numbered line. The pixel circuit 5O of odd-numbered line and the pixel circuit 5E of the following even-numbered line are formed symmetric to the scanning line DSL in between. FIG. 10 is a view showing the layout of the pixel circuit by the configuration of the related art in comparison to FIG. 9. FIG. 11 is a connection diagram showing the configuration of the display unit when the scanning line is commonly used with the odd-numbered line and the even-numbered line.

In the present embodiment, as one unit is configured by the even-numbered lines, and the scanning line DSL of the power supply drive signal DS is commonly used with the odd-numbered line and the even-numbered line, the wiring pattern on the insulating substrate can be more efficiently arranged compared to the related art in the extending direction of the signal line.

The scanning line DSL can be easily commonly used by forming the pixel circuit 5O of odd-numbered line and the pixel circuit 5E of the following even-numbered line symmetric to the scanning line DSL in between.

<Variant>

Figure 12:
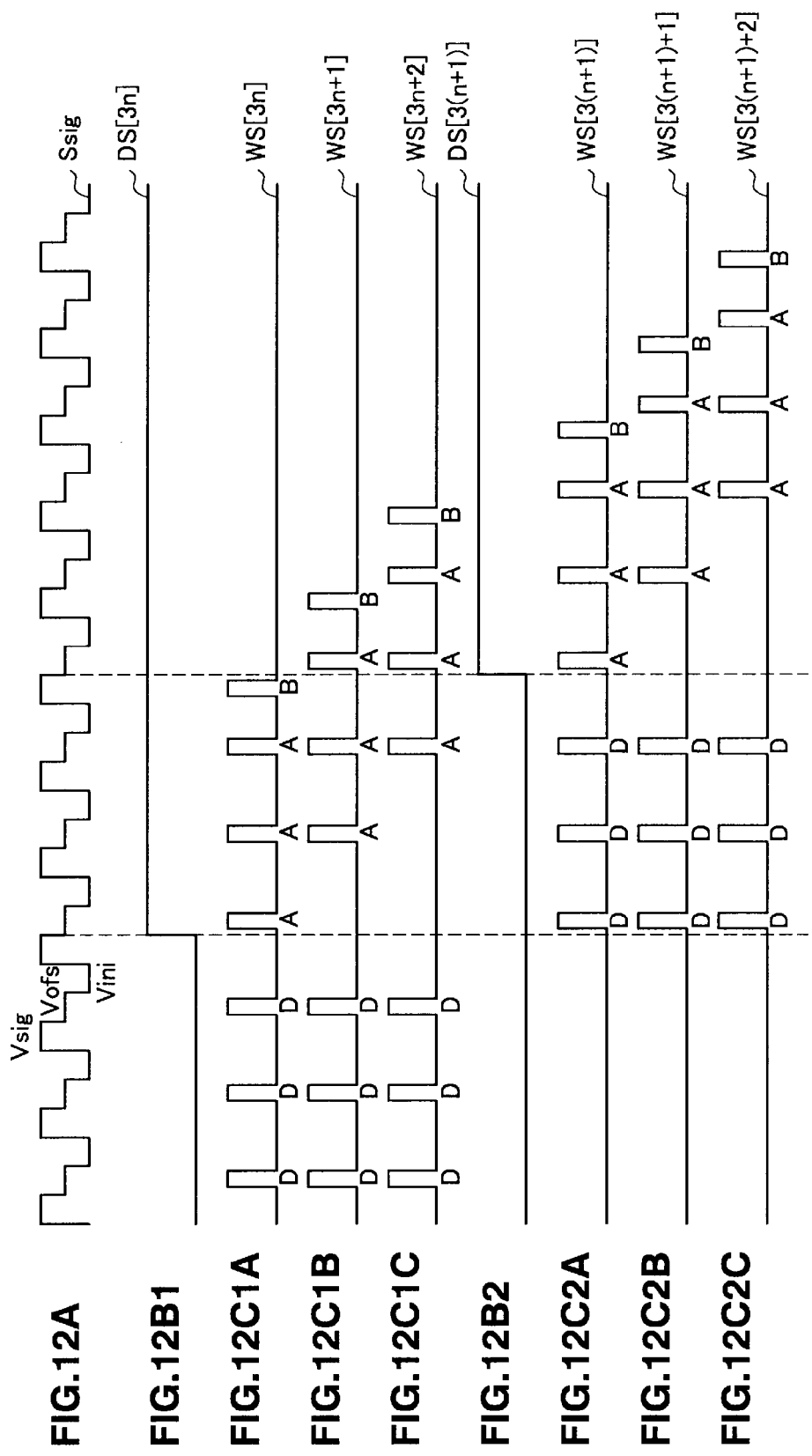

In the embodiment described above, a case of forming by delaying the write signal WS sequentially by one horizontal scanning period in the successive lines has been described, but the present invention is not limited thereto, and application can be widely made when separating the period (symbol D) for setting the inter-terminal voltage of the retention capacity to greater than or equal to the threshold voltage of the drive transistor Tr2, and the period (symbol A) for setting the inter-terminal voltage of the retention capacity to the threshold voltage of the drive transistor Tr2 by the discharge through the drive transistor, and commonly using the period D for setting the inter-terminal voltage of the retention capacity to greater than or equal to the threshold voltage of the drive transistor Tr2 in a plurality of successive lines, as shown in FIG. 12 in comparison to FIG. 4. In FIG. 12, the drive signal is commonly used in units of three lines.

In the embodiment described above, a case of ON operating the write transistor Tr1 while the voltage of the signal line is set to the threshold voltage correction fixed voltage Vofs in the process of setting the inter-terminal voltage of the retention capacity to greater than or equal to the threshold voltage of the drive transistor Tr2 has been described, but the present invention is not limited thereto, and the write transistor Tr1 may be OFF operated after the voltage of the signal line is changed to the light-off reference voltage Vini.

Furthermore, in the embodiment described above, a case of applying the present invention to the image display apparatus of unit drive method and starting the non-light emission period by the setting of the light-off reference voltage has been described, but the present invention is not limited thereto, and the setting of the light-off reference voltage may be omitted when sufficient characteristics can be ensured from a practical standpoint so that the non-light emission period can start by the fall to the voltage Vss of the drive signal DS.

In the embodiment described above, a case of setting the inter-terminal voltage of the retention capacity to the voltage of greater than or equal to the threshold voltage of the drive transistor Tr2 by setting the gate side end voltage of the retention capacity to the voltage Vofs through the signal line has been described, but the present invention is not limited thereto, and application can be widely made even when separately arranging a transistor and setting the gate side end voltage of the retention capacity to the voltage Vofs through the transistor.

In the embodiment described above, a case of executing the discharge of the inter-terminal voltage of the retention capacity through the drive transistor over plural periods has been described, but the present invention is not limited thereto, and application can be widely made even when executing the discharging process in one period.

In the embodiment described above, a case of applying the present invention to the image display apparatus of the unit drive method has been described, but the present invention is not limited thereto, and application can be widely made even to the image display apparatus other than the unit drive method.

Figure 13:
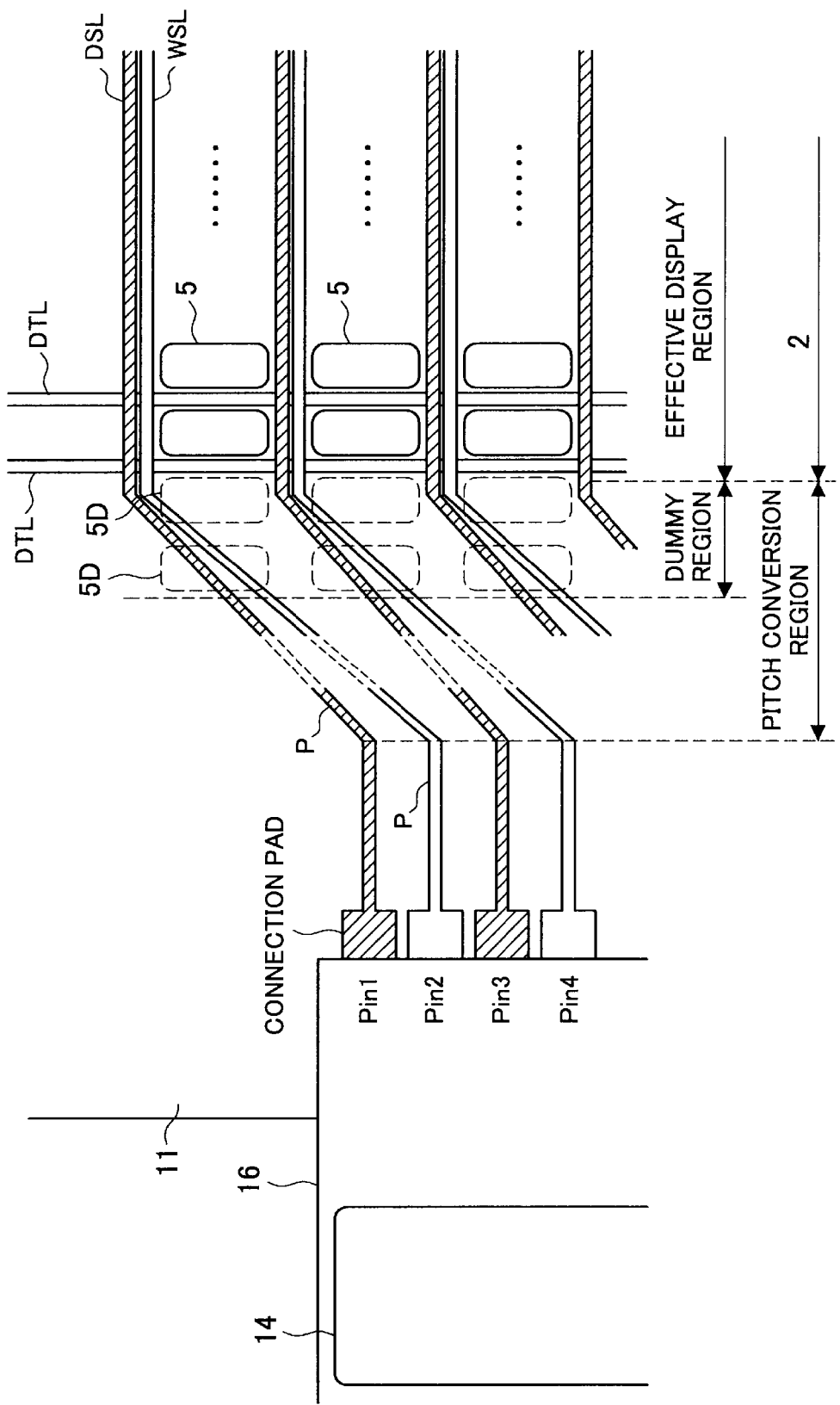
FIG. 13 is a plan view showing an image display apparatus according to another embodiment different from FIG. 12.
Figure 14:
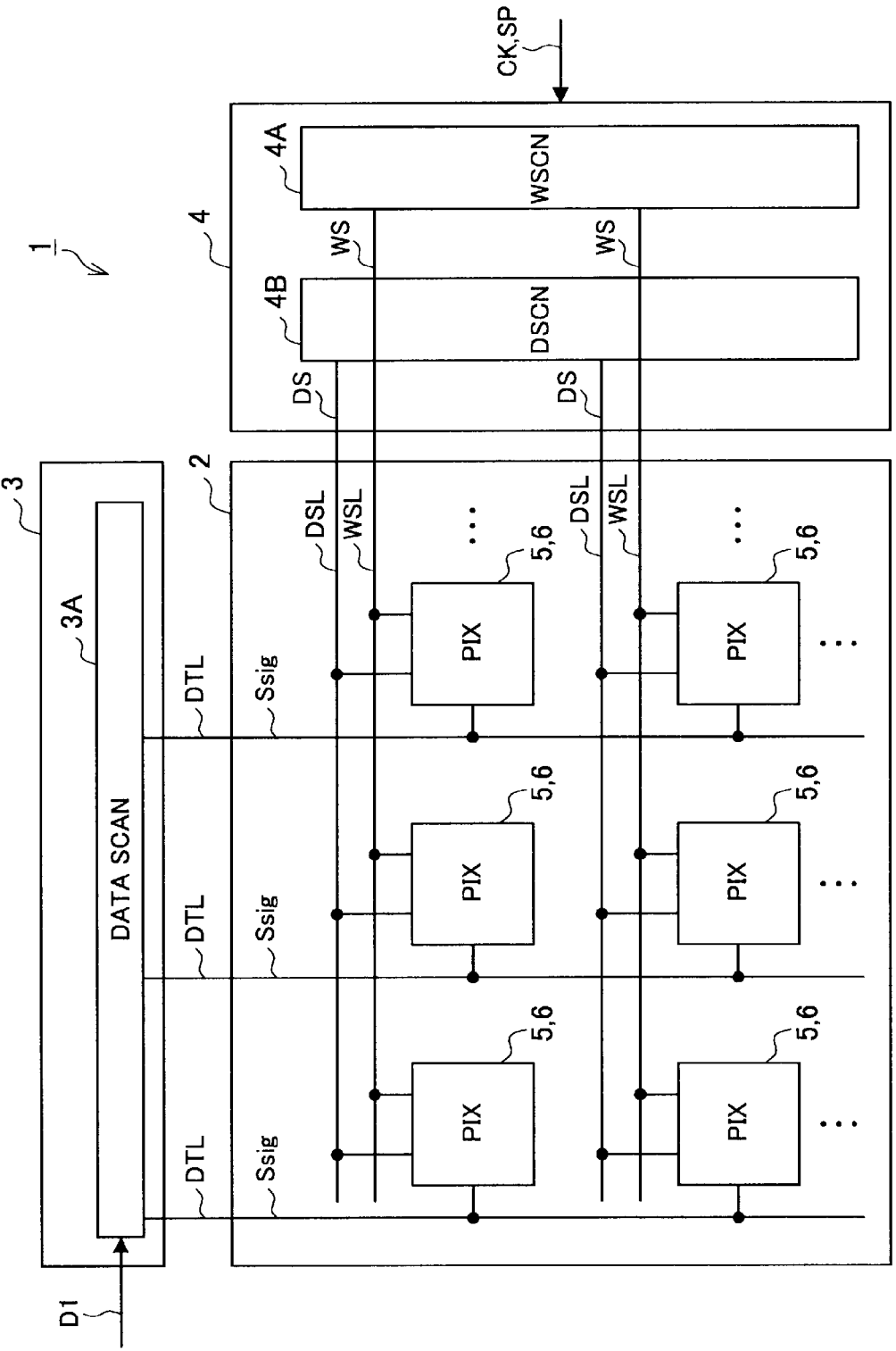
FIG. 14 is a block diagram showing an image display apparatus of the related art.

In other words, a case of applying to the image display apparatus described in FIG. 26 in comparison to FIG. 1 is shown in FIG. 13, where the pitch conversion region of the scanning lines DSL, WSL are arranged in the dummy region, and the wiring pattern on the insulating substrate can be more efficiently arranged compared to the related art in the extending direction of the scanning lines DSL, WSL in the image display apparatus other than the unit drive method.

Similarly, the wiring pattern on the insulating substrate can be more efficiently arranged compared to the related art in the extending direction of the signal line by applying to the image display apparatus described in FIG. 26 and commonly using the scanning line DSL of the power supply drive signal DS with the odd-numbered line and the following even-numbered line. In this case, the light emission period sequentially starts delayed by one horizontal scanning period for every scanning line, but the non-light emission period starts simultaneously in the odd-numbered line and the even-numbered line.

In the embodiment described above, a case of applying the N-channel transistor to the drive transistor has been described, but the present invention is not limited thereto, and application can be widely made to the image display apparatus and the like in which the P-channel transistor is applied to the drive transistor.

In the embodiment descried above, a case of applying the present invention to the image display apparatus of the organic EL element has been described, but the present invention is not limited thereto, and application can be widely made to the image display apparatus of various types of self-luminous elements of current driving type.

The present invention can be applied to an active matrix image display apparatus including the organic EL element.

The present application contains subject matter related to that disclosed in Japanese Priority Patent Application JP 2008-226759 filed in the Japan Patent Office on 4 Sep. 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display apparatus, comprising:
a plurality of pixel circuits arranged in a matrix form in a pixel region of a display unit;
a plurality of output lines comprising first output lines and second output lines, where each of the plurality of output lines is connected to at least one of the plurality of pixels circuits and the second output lines are grouped into second-output-units, each second-output-unit comprising 2 or more second output lines that are connected to each other;
an output line drive circuit configured to selectively introduce a first output signal severally to the first output lines and a second output signal severally to second-output-units,
wherein the output line drive circuit is connected to the plurality of output lines by a output-line-connection wiring pattern formed on the insulating substrate, and
wherein the output-line-connection wiring pattern comprises first connection lines and second connection lines arranged such that:
each of the first connection lines corresponds to one of the first output lines and each respective first connection line is connected at a first end to a corresponding terminal of the output line drive circuit and at a second end to the first output line to which the respective first connection line corresponds, and
each of the second connection lines corresponds to one of the second-output-units and each respective second connection line is connected at a first end to a corresponding terminal of the output line drive circuit and at a second end, in a coupling region, to each of the second output lines that are grouped into the second-output-unit to which the respective second connection line corresponds.

2. The image display apparatus according to claim 1, wherein the pixel circuit includes a light emitting element, a first transistor, a second transistor, and a capacitor.

3. The image display apparatus according to claim 2,
wherein the first transistor is configured to supply a fixed voltage to the capacitor, and
wherein a gate of the first transistor is connected to the first output line.

4. The image display apparatus according to claim 2,
wherein the first transistor is configured to supply a fixed voltage to a gate of the second transistor, and
wherein a gate of the first transistor is connected to the first output line.

5. The image display apparatus according to claim 2,
wherein the second output line is configured to supply a second scan signal to start a correction of a variation in a threshold voltage of the second transistor.

6. The image display apparatus according to claim 2, wherein a pitch of the first output line is different with a pitch of the terminal of the output line drive circuit corresponding to the first output line.

7. An image display apparatus, comprising:
a plurality of pixel circuits;
a plurality of output lines comprising first output lines and second output lines, where each of the plurality of output lines is connected to at least one of the plurality of pixels circuits and the second output lines are grouped into second-output-units, each second-output-unit comprising 2 or more second output lines that are connected to each other;
a plurality of first connection lines; and
a plurality of second connection lines,
wherein each of the first connection lines corresponds to one of the first output lines and each respective first connection line is connected at a first end to a corresponding terminal of the output line drive circuit and at a second end to the first output line, and
wherein each of the second connection lines corresponds to one of the second-output-units and each respective second connection line is connected at a first end to a corresponding terminal of the output line drive circuit and at a second end to each of second-output-units.

8. The image display apparatus according to claim 7, wherein the pixel circuit includes a light emitting element, a first transistor, a second transistor, and a capacitor.

9. The image display apparatus according to claim 8,
wherein the first transistor is configured to supply a fixed voltage to the capacitor, and
wherein a gate of the first transistor is connected to the first output line.

10. The image display apparatus according to claim 8,
wherein the first transistor is configured to supply a fixed voltage to a gate of the second transistor, and
wherein a gate of the first transistor is connected to the first output line.

11. The image display apparatus according to claim 8,
wherein the second output line is configured to supply a second scan signal to start a correction of a variation in a threshold voltage of the second transistor.

12. The image display apparatus according to claim 8, wherein a pitch of the first output line is different with a pitch of the terminal of the output line drive circuit corresponding to the first output line.

* * * * *